(12) United States Patent
Umehara et al.

(10) Patent No.: US 9,842,884 B2
(45) Date of Patent: Dec. 12, 2017

(54) PHOTOELECTRIC CONVERSION ELEMENT AND IMAGE SENSOR

(71) Applicant: TORAY INDUSTRIES, INC., Tokyo (JP)

(72) Inventors: Masaaki Umehara, Otsu (JP); Tsuyoshi Tominaga, Otsu (JP); Jinwoo Kwon, Seoul (KR)

(73) Assignee: Toray Industries, Inc., Tokyo (JP)

( * ) Notice: Subject to any disclaimer, the term of this patent is extended or adjusted under 35 U.S.C. 154(b) by 0 days.

(21) Appl. No.: 15/116,353

(22) PCT Filed: Jan. 29, 2015

(86) PCT No.: PCT/JP2015/052530
§ 371 (c)(1),
(2) Date: Aug. 3, 2016

(87) PCT Pub. No.: WO2015/119039
PCT Pub. Date: Aug. 13, 2015

(65) Prior Publication Data
US 2016/0351810 A1    Dec. 1, 2016

(30) Foreign Application Priority Data

Feb. 5, 2014  (JP) .................. 2014-020139

(51) Int. Cl.
*H01L 51/00* (2006.01)
*H01L 51/42* (2006.01)
(Continued)

(52) U.S. Cl.
CPC ............ *H01L 27/307* (2013.01); *C09K 11/06* (2013.01); *H01L 51/008* (2013.01);
(Continued)

(58) Field of Classification Search
CPC . C09K 11/06; H01L 2251/308; H01L 27/307; H01L 51/0053; H01L 51/0068;
(Continued)

(56) References Cited

U.S. PATENT DOCUMENTS

2010/0267180 A1  10/2010  Kojima
2014/0008619 A1   1/2014  Lee
2015/0303377 A1*  10/2015  Thompson .......... C09B 23/0008
                                    548/402

FOREIGN PATENT DOCUMENTS

CN  103172650  6/2013
JP  051295576  5/1993
(Continued)

OTHER PUBLICATIONS

International Search Report and Written Opinion for International Application No. PCT/JP2015/052530, dated Mar. 31, 2015, 9 pages.
(Continued)

*Primary Examiner* — Tom Thomas
*Assistant Examiner* — Benjamin Tzu-Hung Liu
(74) *Attorney, Agent, or Firm* — RatnerPrestia

(57) ABSTRACT

Disclosed is a photoelectric conversion element for converting light into electric energy, including a first electrode, a second electrode, and at least one organic layer existing therebetween, the organic layer containing a compound represented by the general formula (1):

(Continued)

[Chemical Formula 1]

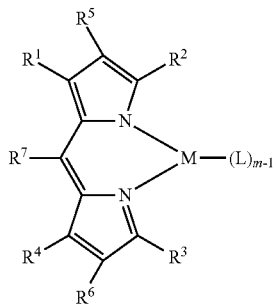

(1)

wherein $R^1$ to $R^4$ are alkyl groups, cycloalkyl groups, alkoxy groups, or arylether groups, which may be respectively the same or different; $R^5$ and $R^6$ are halogens, hydrogens, or alkyl groups, which may be respectively the same or different; $R^7$ is an aryl group, a heteroaryl group, or an alkenyl group; M represents an m-valent metal and is at least one selected from boron, beryllium, magnesium, aluminum, chromium, iron, nickel, copper, zinc, and platinum; L is selected from halogen, hydrogen, an alkyl group, an aryl group, and a heteroaryl group; and m is in a range of 1 to 6 and, when m−1 is 2 or more, each L may be the same or different.

10 Claims, 3 Drawing Sheets

(51) Int. Cl.
  *H01L 51/44* (2006.01)
  *H01L 27/30* (2006.01)
  *C09K 11/06* (2006.01)

(52) U.S. Cl.
  CPC ...... *H01L 51/0053* (2013.01); *H01L 51/0068* (2013.01); *H01L 51/4206* (2013.01); *H01L 51/441* (2013.01); *H01L 51/447* (2013.01); *H01L 51/448* (2013.01); *H01L 51/4253* (2013.01); *H01L 2251/308* (2013.01); *Y02E 10/549* (2013.01)

(58) Field of Classification Search
  CPC .............. H01L 51/008; H01L 51/4206; H01L 51/4253; H01L 51/441; H01L 51/447; H01L 51/448; Y02E 10/549
  See application file for complete search history.

(56) References Cited

FOREIGN PATENT DOCUMENTS

| | | |
|---|---|---|
| JP | 08509471 | 10/1996 |
| JP | 2000208262 | 7/2000 |
| JP | 2002076391 | 3/2002 |
| JP | 2007527361 | 9/2007 |
| JP | 2009290190 | 12/2009 |
| JP | 2010522708 | 7/2010 |
| JP | 2011077198 | 4/2011 |
| WO | 2009116456 | 9/2009 |
| WO | WO 2009116456 * 9/2009 | ............ C09K 11/06 |
| WO | 2013066453 | 5/2013 |

OTHER PUBLICATIONS

Tahsin Kilicoglu, et al., Electrical and Photovoltaic Properties of an Organic-inorganic Heterojunction based on a BODIPY dye, Microelectronic engineering, 2011, vol. 88, No. 2, pp. 150-154.

Kollmannsberger et al., "Electrogenerated Chemiluminescence and Proton-Dependent Switching of Fluorescence: Functionalized Difluoroboradiaza-s-indacenes", Angew Chem. Int. Ed. Engl. 1997, vol. 36, No. 12, pp. 1333-1335.

Burghart et al., "3,5-Diaryl-4,4-difluoro-4-bora-3a,4a-diaza-s-indacene (BODIPY) Dyes: Synthesis, Spectroscopic, Electrochemical, and Structural Properties", J. Org. Chem., 1999, vol. 64, pp. 7813-7819.

* cited by examiner

PHOTOELECTRIC CONVERSION ELEMENT AND IMAGE SENSOR

CROSS-REFERENCE TO RELATED APPLICATIONS

This is the U.S. National Phase application of PCT International Application No. PCT/JP2015/052530, filed Jan. 29, 2015, and claims priority to Japanese Patent Application No. 2014-020139, filed Feb. 5, 2014, the disclosures of each of these applications being incorporated herein by reference in their entireties for all purposes.

FIELD OF THE INVENTION

The present invention relates to a photoelectric conversion element which can convert light into electric energy. More particularly, the present invention relates to a photoelectric conversion element which can be employed in the fields of solar cells, image sensors, and the like.

BACKGROUND OF THE INVENTION

The photoelectric conversion element capable of converting light into electric energy can be employed in solar cells, image sensors, and the like. In particular, there has widely been used an image sensor in which a current generated by incident light in a photoelectric conversion element is read out by CCD and CMOS circuits.

In an image sensor using a photoelectric conversion element, an inorganic substance has hitherto been employed as a material composing the photoelectric conversion film. However, the inorganic substance cannot absorb only light having a specific wavelength because of its low color selectivity. Therefore, there was a need that a color filter is provided before a photoelectric conversion film to selectively transmit only specific colors (for example, red, green, and blue colors) from incident light. However, during imaging a fine object, use of the color filter may lead to an interference between the pitch of the object and that of an image element, thus generating an image which is different from an original image (Moire defects). When an optical lens is used so as to suppress the generation of the defects, there arises a problem such as deterioration of efficiency for light utilization and an aperture ratio.

Meanwhile, growing demands for higher resolution of the image sensor create an opportunity of the progress of microfabrication of pixels. Therefore, the size of pixels tends to decrease. Reduction in size of pixels leads to a decrease in quantity of light which reaches the photoelectric conversion element of each pixel, thus causing deterioration of sensitivity.

To solve these problems, a study has been made of a photoelectric conversion element using an organic compound.

Since the organic compound can selectively absorb light in a specific wavelength region of light being incident according to a molecular structure, it becomes unnecessary for the photoelectric conversion element using an organic compound to use a color filter. It is also possible to enhance efficiency for light utilization because of high absorption coefficient. There have been known, as the photoelectric conversion element using an organic compound, specifically, element structures in which a p-n junction structure and a bulk heterojunction structure are introduced into a photoelectric conversion film sandwiched between an anode and a cathode (see, for example, Patent Literatures 1 to 3).

There has also been known an element structure in which a charge blocking layer is inserted so as to reduce a dark current (see, for example, Patent Literature 4).

CITATION LIST

Patent Literature

[Patent Literature 1]
  Japanese Unexamined Patent Publication (Kokai) No. 2009-290190
[Patent Literature 2]
  Japanese Unexamined Patent Publication (Kokai) No. 2011-077198
[Patent Literature 3]
  Japanese Unexamined Patent Publication (Kokai) No. 2002-076391
[Patent Literature 4]
  Japanese Unexamined Patent Publication (Kokai) No. 5-129576

SUMMARY OF THE INVENTION

Although superiority of use of the photoelectric conversion element using an organic compound in an image sensor can be confirmed, in principle, there are numerous technical problems for putting it into practical use. In particular, an improvement in color selectivity is one of important problems to be solved.

Thus, an object of the present invention is to solve the problems of the prior art and to provide a photoelectric conversion element with high photoelectric conversion efficiency and high color selectivity.

The present invention includes a photoelectric conversion element for converting light into electric energy, including a first electrode, a second electrode, and at least one organic layer existing therebetween, the organic layer containing a compound represented by the general formula (1):

[Chemical Formula 1]

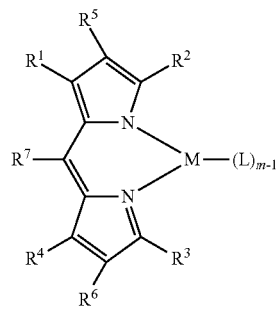

(1)

wherein $R^1$ to $R^4$ are alkyl groups, cycloalkyl groups, alkoxy groups, or arylether groups, which may be respectively the same or different; $R^5$ and $R^6$ are halogens, hydrogens, or alkyl groups, which may be respectively the same or different; $R^7$ is an aryl group, a heteroaryl group, or an alkenyl group; M represents an m-valent metal and is at least one selected from boron, beryllium, magnesium, aluminum, chromium, iron, nickel, copper, zinc, and platinum; L is selected from halogen, hydrogen, an alkyl group, an aryl group, and a heteroaryl group; and m is in a range of 1 to 6 and, when m−1 is 2 or more, each L may be the same or different.

According to the present invention, it is possible to provide a photoelectric conversion element with high photoelectric conversion efficiency and high color selectivity.

DETAILED DESCRIPTION OF EMBODIMENTS OF THE INVENTION

<Photoelectric Conversion Element>

The photoelectric conversion element of an embodiment of the present invention is a photoelectric conversion element for converting light into electric energy, including a first electrode, a second electrode, and at least one organic layer existing therebetween, the organic layer containing a compound represented by the general formula (1).

Figure 1:
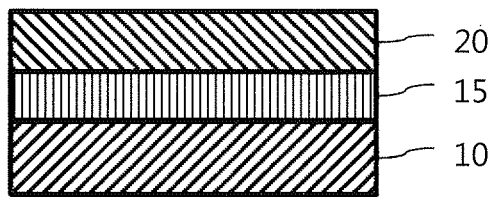
FIG. 1 is a schematic cross-sectional view showing an example of a photoelectric conversion element of the present invention.

Herein, the organic layer includes at least one photoelectric conversion layer for converting light into electric energy. Examples of the photoelectric conversion element of the present invention are shown in FIG. 1 to FIG. 4. FIG. 1 shows an example of a photoelectric conversion element having a photoelectric conversion layer 15 between a first electrode 10 and a second electrode 20.

Figure 2:
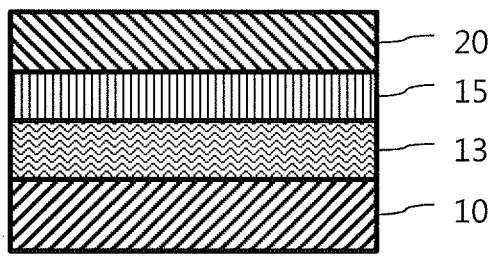
FIG. 2 is a schematic cross-sectional view showing an example of a photoelectric conversion element of the present invention.
Figure 3:
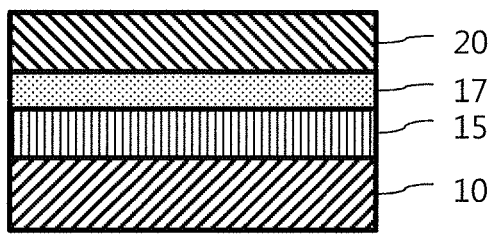
FIG. 3 is a schematic cross-sectional view showing an example of a photoelectric conversion element of the present invention.
Figure 4:
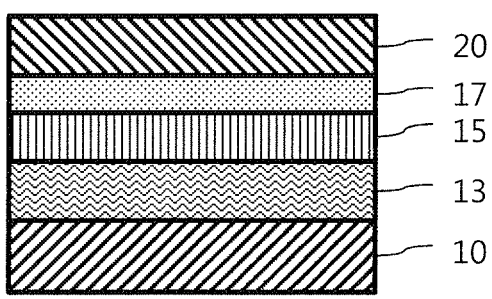
FIG. 4 is a schematic cross-sectional view showing an example of a photoelectric conversion element of the present invention.

It is possible to employ, in addition to a structure in which an organic layer is composed only of one photoelectric conversion layer as shown in FIG. 1, a structure in which a charge blocking layer is inserted between an anode and a cathode as shown in FIGS. 2 to 4. The charge blocking layer is a layer having a function of blocking electrons or holes. The charge blocking layer is called an electron blocking layer 13 when inserting between the anode and the photoelectric conversion layer, or hole blocking layer 17 when inserting between the cathode and the photoelectric conversion layer. The organic layer may include either or both of these layers.

A description will be made below by enumerating, as an example, the case where a first electrode 10 is an anode and a second electrode 20 is a cathode.

(Anode and Cathode)

In the photoelectric conversion element, the anode and the cathode have a role to allow electrons and holes produced in the element to flow to thereby sufficiently apply a current. At least one of the anode and the cathode is preferably transparent or translucent so as to make light incident on the photoelectric conversion layer. Usually, a transparent electrode is preferably used as the anode to be formed on the substrate.

The anode is preferably made of a material which is capable of efficiently extracting holes from the photoelectric conversion layer and is also transparent. The material is preferably a conductive metal oxide such as tin oxide, indium oxide, or indium tin oxide (ITO); metal such as gold, silver, or chromium; an inorganic conductive substance such as copper iodide or copper sulfide; or a conductive polymer such as polythiophene, polypyrrole, or polyaniline; and it is particularly preferable to use an ITO glass or Nesa glass in which a transparent conductive film is formed on a glass substrate. It is desirable that the transparent electrode allows the current produced in the element to flow sufficiently, and low resistance is preferable from a viewpoint of photoelectric conversion efficiency of the element. For example, an ITO substrate having a resistance value of $300\Omega/\square$ or less is particularly preferable. When using the ITO substrate, the thickness of ITO can be optionally selected according to the resistance value, and is usually in a range of 50 to 300 nm. The lesser ions eluted from glass, the better, so that the material of the glass substrate is preferably alkali-free glass, or soda-lime glass subjecting to $SiO_2$ barrier coating. The thickness of the glass substrate is preferably 0.5 mm or more from a viewpoint of mechanical strength. If the anode stably functions, there is no need that the substrate is made of glass and, for example, an ITO film may be formed on a plastic substrate to obtain an anode. Examples of the method for formation of an ITO film include, but are not limited to, an electron beam method, a sputtering method, a chemical reaction method, and the like.

The material of the cathode is preferably a substance capable of efficiently extracting electrons from the photoelectric conversion layer. Examples of the material include platinum, gold, silver, copper, iron, tin, zinc, aluminum, indium, chromium, lithium, sodium, potassium, calcium, magnesium, cesium, strontium, and the like. To improve element characteristics by enhancing electron extraction efficiency, a low work-function metal selected from lithium, sodium, potassium, calcium, magnesium, and cesium, or an alloy containing these low work-function metals is effective. However, these low work-function metals are often unstable in atmospheric air. Therefore, it is possible to exemplify, as a preferable example, a method in which an electrode having high stability is used after doping with a trace amount of lithium, magnesium, or cesium (1 nm or less displayed by a film thickness meter of vacuum vapor deposition). It is also possible to use an inorganic salt such as lithium fluoride. To protect the electrode, it is preferred to laminate metals such as platinum, gold, silver, copper, iron, tin, aluminum, and indium, or alloys using these metals; inorganic substances such as silica, titania, and silicon nitride; polyvinyl alcohol, vinyl chloride, hydrocarbon-based polymers, and the like. It is possible to use, as the method for production of these electrodes, methods such as resistance heating, electron beam, sputtering, ion plating, and coating methods.

(Photoelectric Conversion Layer)

The photoelectric conversion layer may be composed of a photoelectric conversion element material alone. To obtain high photoelectric conversion efficiency, the photoelectric conversion layer is preferably composed of two or more photoelectric conversion element materials, and more preferably composed of an electron-donating photoelectric conversion element material and an electron-accepting photoelectric conversion element material. When the photoelectric conversion layer is composed of two or more photoelectric conversion element materials, the photoelectric conversion layer may be a single layer in which two or more photoelectric conversion element materials are mixed, or plural layers in which layers composed of one or more photoelectric conversion element material(s) are laminated. Furthermore, the photoelectric conversion layer may have a structure in which a mixed layer is mixed with each single layer.

The electron-accepting property as used herein means a property of easily accepting electrons because of high electron affinity. The electron-donating property is a property of easily donating electrons. When the photoelectric conversion layer is composed of an n-type organic semiconductor material having high electron-accepting property and a p-type organic semiconductor material having high electron-donating property, it is possible to efficiently separate into electrons and holes before excitons produced by incident light in the photoelectric conversion layer return to a ground state. Electrons and holes thus separated respectively flow to the cathode and the anode through the n-type organic semiconductor material and the p-type organic semiconductor material, thus enabling high photoelectric conversion efficiency.

The absorption wavelength of the photoelectric conversion layer is determined by the light absorption wavelength region of the photoelectric conversion material composing the photoelectric conversion layer, so that it is preferred to use a material having light absorption characteristics corresponding to the color intended for use. For example, in the green photoelectric conversion element, the photoelectric conversion layer is composed of a material which absorbs light at a wavelength of 450 nm to 550 nm. As mentioned above, when the photoelectric conversion layer is composed of two or more materials so as to obtain high photoelectric conversion efficiency, it is preferred that the photoelectric conversion layer is composed of a material in which the energy level of the p-type organic semiconductor material and the n-type organic semiconductor material enables efficient separation of holes and electrons, thus enabling transfer to the electrode side.

The p-type organic semiconductor material may be any organic compound as long as it is a hole-transporting compound which has comparatively small ionization potential and has electron-donating property. Examples of the p-type organic semiconductor material include compounds including fused polycyclic aromatic derivatives such as naphthalene, anthracene, phenanthrene, pyrene, chrysene, naphthacene, triphenylene, perylene, fluoranthene, fluorene, indene, and derivatives thereof; cyclopentadiene derivatives, furan derivatives, thiophene derivatives, pyrrole derivatives, benzofuran derivatives, benzothiophene derivatives, indole derivatives, pyrazoline derivatives, dibenzofuran derivatives, dibenzothiophene derivatives, carbazole derivatives, indolocarbazole derivatives; aromatic amine derivatives such as N,N'-dinaphthyl-N,N'-diphenyl-4,4'-diphenyl-1,1'-diamine; styrylamine derivatives, benzidine derivatives, porphyrin derivatives, phthalocyanine derivatives, quinacridone derivatives, and the like. Examples of the polymer-based p-type organic semiconductor material include polyphenylenevinylene derivatives, polyparaphenylene derivatives, polyfluorene derivatives, polyvinylcarbazole derivatives, and polythiophene derivatives.

The n-type organic semiconductor material may be any material as long as it is an electron-transporting compound having high electron affinity. Examples of the n-type organic semiconductor material include fused polycyclic aromatic derivatives such as naphthalene and anthracene; styryl-based aromatic ring derivatives typified by 4,4'-bis(diphenylethenyl)biphenyl, tetraphenylbutadiene derivatives, coumarin derivatives, oxadiazole derivatives, pyrrolopyridine derivatives, perinone derivatives, pyrrolopyrrole derivatives, thiadiazolopyridine derivatives, pyrimidine derivatives, triazine derivatives, aromatic acetylene derivatives, aldazine derivatives, pyrromethene derivatives, diketopyrrolo[3,4-c]pyrrole derivatives; azole derivatives such as imidazole, thiazole, thiadiazole, oxazole, oxadiazole, and triazole, and metal complexes thereof; quinone derivatives such as anthraquinone and diphenoquinone; phosphorus oxide derivatives, and quinolinol complexes such as tris(8-quinolinolate)aluminum(III); and various metal complexes such as benzoquinolinol complex, hydroxyazole complex, azomethine complex, tropolone-metal complex, and flavonol-metal complex. Examples thereof further include organic compounds having a nitro group, a cyano group, halogen, or a trifluoromethyl group in the molecule; acid anhydride-based compounds such as quinone-based compound, maleic anhydride, and phthalic anhydride; and fullerene and fullerene derivatives, such as C60 and PCBM.

The below-mentioned compound represented by the general formula (1) has an absorption coefficient of $1 \times 10^5$ cm$^{-1}$ or more, and the absorption coefficient is more than one to two order(s) of magnitude higher than that of an inorganic photoelectric conversion material which has hitherto been used. Therefore, it is possible to convert into electric energy by efficiently absorb light, thus enabling an improvement in sensitivity of the photoelectric conversion element. Furthermore, the compound represented by the general formula (1) has a sharp absorption spectrum, leading to high wavelength selection accuracy, thus enabling an improvement in color selectivity of the photoelectric conversion element.

The compound represented by the general formula (1) absorbs light in the wavelength region of about 450 nm to 550 nm, so that it is preferably used in a green photoelectric conversion layer. The compound represented by the general formula (1) contains a pyrromethene skeleton, so that it preferably serves as an electron-accepting photoelectric conversion element material. Therefore, the compound is preferably used as an n-type organic semiconductor material.

(Charge Blocking Layer)

The charge blocking layer is a layer for taking out electrons and holes photoelectrically converted by the photoelectric conversion layer in an efficient and stable manner, and examples thereof include an electron blocking layer for blocking electrons and a hole blocking layer for blocking holes. These layers may be composed of an inorganic substance or an organic compound. These layers may also be composed of a mixed layer of an inorganic substance and an organic compound.

The hole blocking layer is a layer for blocking recombination of holes produced in the photoelectric conversion layer with electrons as a result of flow of holes to the cathode side. According to types of the material composing each layer, recombination of holes with electrons is suppressed by inserting this layer, leading to an improvement in photoelectric conversion efficiency. The hole blocking material preferably has an HOMO level which is energetically lower than that of the photoelectric conversion material. Specific examples of preferable hole blocking material capable of efficiently blocking transfer of holes from the photoelectric conversion layer include quinolinol derivative metal complexes typified by 8-hydroxyquinoline aluminum; tropolone-metal complexes, flavonol-metal complexes, perylene derivatives, perinone derivatives, naphthalene derivatives, coumarin derivatives, oxadiazole derivatives, aldazine derivatives, bisstyryl derivatives, and pyrazine derivatives; oligopyridine derivatives such as bipyridine and terpyridine; phenanthroline derivatives, quinoline derivatives, aromatic phosphorus oxide compounds, and the like. These hole blocking materials may be used alone, or two or more hole blocking materials may be used in a state of being laminated or mixed.

The electron blocking layer is a layer for blocking recombination of electrons produced in the photoelectric conversion layer with holes as a result of flow of electrons to the cathode side. According to types of the material composing each layer, recombination of holes with electrons is suppressed by inserting this layer, leading to an improvement in photoelectric conversion efficiency. The electron blocking material preferably has an HOMO level which is energetically higher than that of the photoelectric conversion material. Specific examples of preferable electron blocking material capable of efficiently blocking transfer of electrons from the photoelectric conversion layer include triphenylamines such as N,N'-diphenyl-N,N'-bis(3-methylphenyl)-4,4'-diphenyl-1,1'-diamine and N,N'-bis(l-naphthyl)-N,N'-diphenyl-4,4'-diphenyl-1,1'-diamine; bis(N-allylcarbazole) or bis(N-alkylcarbazole), pyrazoline derivatives, stilbene-based compounds, distyryl derivatives, hydrazone-based compounds; and heterocyclic compounds typified by oxadiazole derivatives, phthalocyanine derivatives, and porphyrin derivatives. Examples of the polymer-based material include polycarbonate and styrene derivatives containing the monomer in the side chain, polyvinylcarbazole, polysilane, and the like. It is desirable to use a compound which forms a thin film required for production of the element and can extract holes from the photoelectric conversion layer, and also can transport holes. These electron blocking materials may be used alone, or two or more electron blocking materials may be used in a state of being laminated or mixed.

It is also possible to use the hole blocking layer and the electron blocking layer in a state of being dispersed in solvent-soluble resins such as polyvinyl chloride, polycarbonate, polystyrene, poly(N-vinylcarbazole), polymethyl methacrylate, polybutyl methacrylate, polyester, polysulfone, polyphenylene oxide, polybutadiene, hydrocarbon resin, ketone resin, phenoxy resin, polysulfone, polyamide, ethyl cellulose, vinyl acetate, ABS resin, and polyurethane resin; and curable resins such as phenol resin, xylene resin, petroleum resin, urea resin, melamine resin, unsaturated polyester resin, alkyd resin, epoxy resin, and silicone resin; as a polymer binder.

Examples of the method for formation of an organic layer include, but are not limited to, a resistance heating vapor deposition method, an electron beam vapor deposition method, a sputtering method, a molecular lamination method, a coating method, and the like, and the method is preferably a resistance heating vapor deposition method or an electron beam vapor deposition method in view of characteristics. The thickness of each organic layer is influenced by a resistance value of an organic substance, and is preferably in a range of 1 to 1,000 nm.

<Photoelectric Conversion Element Material>

The photoelectric conversion element of an embodiment of the present invention contains, in an organic layer, a compound represented by the general formula (1).

[Chemical Formula 2]

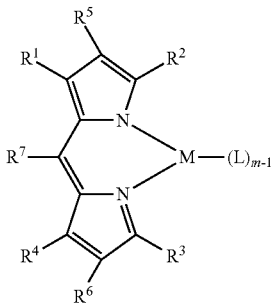

(1)

$R^1$ to $R^4$ are alkyl groups, cycloalkyl groups, alkoxy groups, or arylether groups, which may be the same or different. $R^5$ and $R^6$ are halogens, hydrogens, or alkyl groups, which may be the same or different. $R^7$ is an aryl group, a heteroaryl group, or an alkenyl group. M represents an m-valent metal and is at least one metal selected from boron, beryllium, magnesium, aluminum, chromium, iron, nickel, copper, zinc, and platinum. L is a group selected from halogen, hydrogen, an alkyl group, an aryl group, and a heteroaryl group. m is in a range of 1 to 6 and, when m−1 is 2 or more, each L may be the same or different.

Of these substituents, hydrogen may be deuterium.

The alkyl group represents, for example, a saturated aliphatic hydrocarbon group such as a methyl group, an ethyl group, an n-propyl group, an isopropyl group, an n-butyl group, a sec-butyl group, or a tert-butyl group. The alkyl group may further have a substituent or not. There is no particular limitation on additional substituent when the alkyl group is substituted, and examples thereof include an alkyl group, an aryl group, a heteroaryl group, and the like. This aspect is common for the following description. There is no particular limitation on the carbon number of the alkyl group, and the carbon number is preferably in a range of 1 or more and 20 or less, and more preferably 1 or more and 8 or less, in view of availability and costs.

The cycloalkyl group represents, for example, a saturated alicyclic hydrocarbon group such as cyclopropyl, cyclohexyl, norbornyl, or adamantyl, and may have a substituent or not. There is no particular limitation on the carbon number of the alkyl group moiety, and the carbon number is preferably in a range of 3 or more and 20 or less.

The alkenyl group represents, for example, an unsaturated aliphatic hydrocarbon group having a double bond, such as a vinyl group, an allyl group, or a butadienyl group, and may have a substituent or not. There is no particular limitation on the carbon number of the alkenyl group, and the carbon number is preferably in a range of 2 or more and 20 or less.

The alkoxy group represents, for example, a functional group in which aliphatic hydrocarbon groups are bonded through an ether bond, such as a methoxy group, an ethoxy group, or a propoxy group, and this aliphatic hydrocarbon group may have a substituent or not. There is no particular limitation on the carbon number of the alkoxy group, and the carbon number is preferably in a range of 1 or more and 20 or less.

The arylether group represents, for example, a functional group in which aromatic hydrocarbon groups are bonded through an ether bond, such as a phenoxy group, and the aromatic hydrocarbon group may have a substituent or not. There is no particular limitation on the carbon number of the arylether group, and the carbon number is preferably in a range of 6 or more and 40 or less.

The halogen represents fluorine, chlorine, bromine, or iodine.

The aryl group represents, for example, an aromatic hydrocarbon group such as a phenyl group, a naphthyl group, a biphenyl group, a fluorenyl group, a phenanthryl group, a triphenylenyl group, or a terphenyl group. The aryl group may have a substituent or not. There is no particular limitation on the carbon number of the aryl group, and the carbon number is preferably in a range of 6 or more and 40 or less.

The heteroaryl group represents a cyclic aromatic group having one or plural atom(s) other than carbon in the ring, such as a furanyl group, a thiophenyl group, a pyridyl group, a quinolinyl group, a pyrazinyl group, a pyrimidinyl group, a triazinyl group, a naphthylidyl group, a benzofuranyl group, a benzothiophenyl group, or an indolyl group, and heteroaryl group may have a substituent or not. There is no particular limitation on the carbon number of the heteroaryl group, and the carbon number is preferably in a range of 2 or more and 30 or less.

Of the above substituents, $R^1$ to $R^4$ are preferably alkyl groups which do not extend conjugation of a pyrromethene skeleton of the general formula (1) and exert no influence on the absorption wavelength. Of these alkyl groups, a methyl group or a t-butyl group is more preferable because of its excellent thermal stability. In view of ease of synthesis, a methyl group is used particularly preferably.

$R^5$ and $R^6$ are preferably alkyl groups or hydrogens from a viewpoint of thermal stability, and more preferably hydrogens since it is easy to obtain narrow full width at half maximum in the absorption spectrum.

In the general formula (1), M is preferably at least one selected from the group consisting of boron, beryllium, magnesium, aluminum, chromium, iron, nickel, copper, zinc, and platinum. From a viewpoint of giving a sharp spectrum to obtain a higher absorption coefficient, boron is particularly preferable. When M is boron, m is 3 (m−1 is 2).

L is a 1-valent or a 0-valent group, and is bonded to M through one or two atom(s) in the molecule. Herein, 0-value refers to the case where L is coordinated to M through an unshared electron pair when L is a pyridyl group. Bonding to M through two atoms means so-called chelating coordination. A description of the alkyl group, the aryl group, and the heteroaryl group is as mentioned above.

When M is boron, L is preferably a group selected from fluorine, a fluorine-containing aryl group, a fluorine-containing heteroaryl group, and a fluorine-containing alkyl group, thus obtaining a higher fluorescence quantum yield, so that L is more preferably fluorine or a fluorine-containing aryl group. L is more preferably fluorine in view of ease of synthesis. Herein, the fluorine-containing aryl group is aryl containing fluorine, and examples thereof include a fluorophenyl group, a trifluoromethylphenyl group, and a pentafluorophenyl group. The fluorine-containing heteroaryl group is a heteroaryl group containing fluorine, and examples thereof include a fluoropyridyl group, a trifluoromethylpyridyl group, and a trifluoropyridyl group. The fluorine-containing alkyl group is an alkyl group containing fluorine, and examples thereof include a trifluoromethyl group, a pentafluoroethyl group, and the like.

When M is other than boron, L is preferably a chelating ligand.

$R^7$ is preferably a group selected from an aryl group and a heteroaryl group in view of obtaining higher absorption coefficient and higher heat resistance, and more preferably an aryl group in view of an absorption coefficient. Furthermore, $R^7$ is preferably a bulky substituent. Since bulky $R^7$ enables prevention of cohesion of molecules, high photoelectric conversion efficiency can be obtained with stability over time.

Preferable examples of such bulky substituent include a structure represented by the following general formula (2).

[Chemical Formula 3]

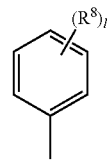

(2)

$R^8$ is an aryl group or a heteroaryl group. A description of the aryl group and the heteroaryl group is as mentioned above. l is an integer of 1 to 3. When l is 2 or more, each $R^8$ may be the same or different. More specifically, $R^8$ is preferably a group represented by any one of the following general formulas (3) to (5).

[Chemical Formula 4]

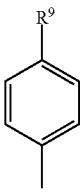

(3)

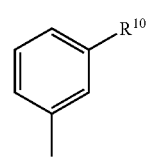

(4)

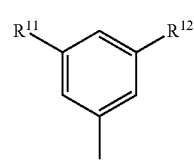

(5)

Herein, $R^9$ to $R^{12}$ are alkyl groups, aryl groups, or heteroaryl groups. A description of the alkyl group, the aryl group, and the heteroaryl group is as mentioned above. In view of obtaining higher photoelectric conversion efficiency, an alkyl group is used more preferably. Because of prevention of cohesion of molecules, a methyl group and a tert-butyl group are exemplified as a preferable example, particularly.

In the general formula (2), l is more preferably 2. $R^8$ is more preferably a group represented by the general formula (5).

Specific examples of the group represented by the general formulas (3) to (5) include, but are not limited to, the followings.

[Chemical Formula 5]
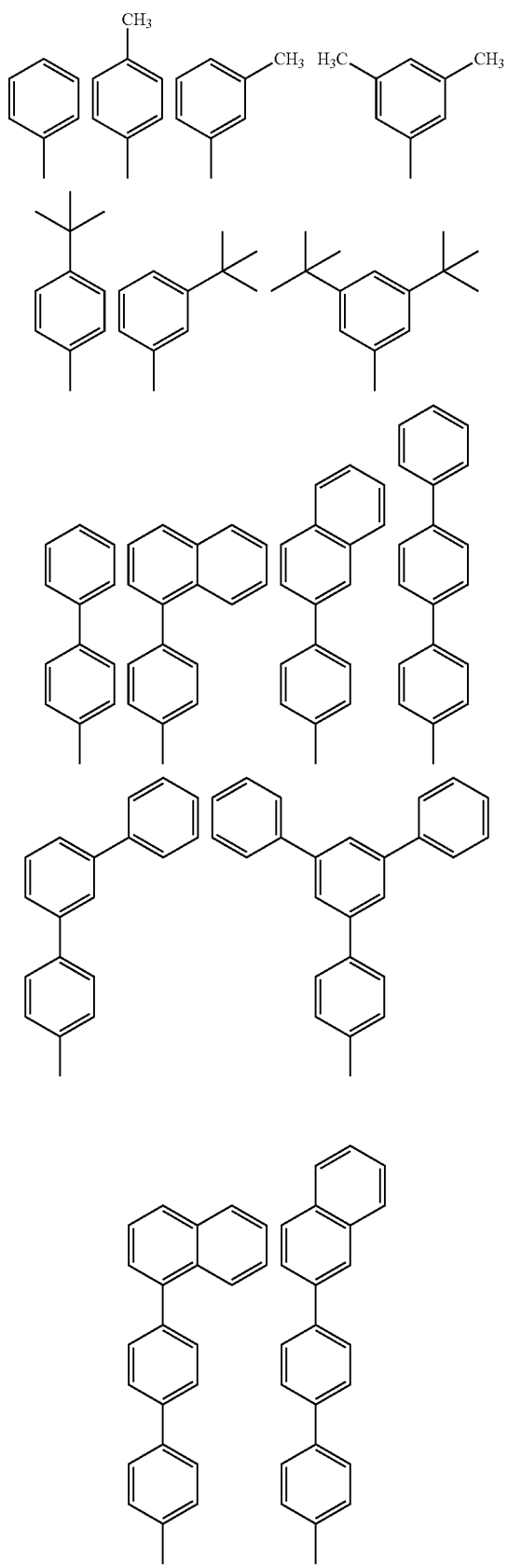
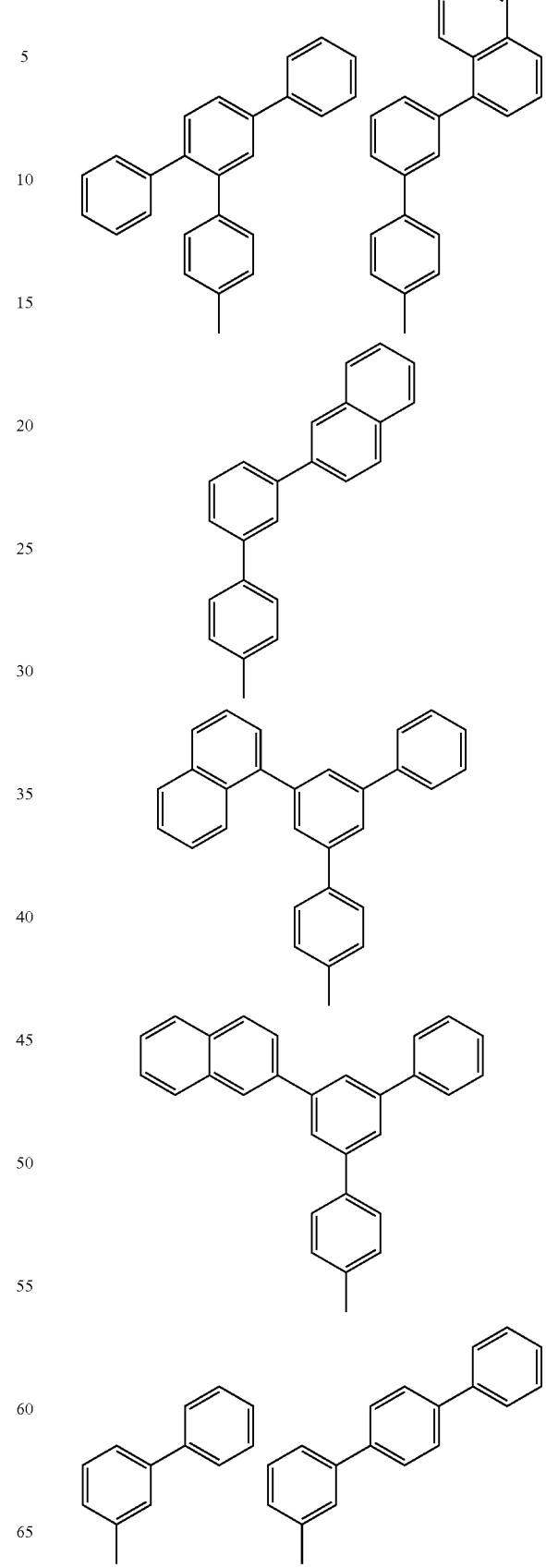

-continued
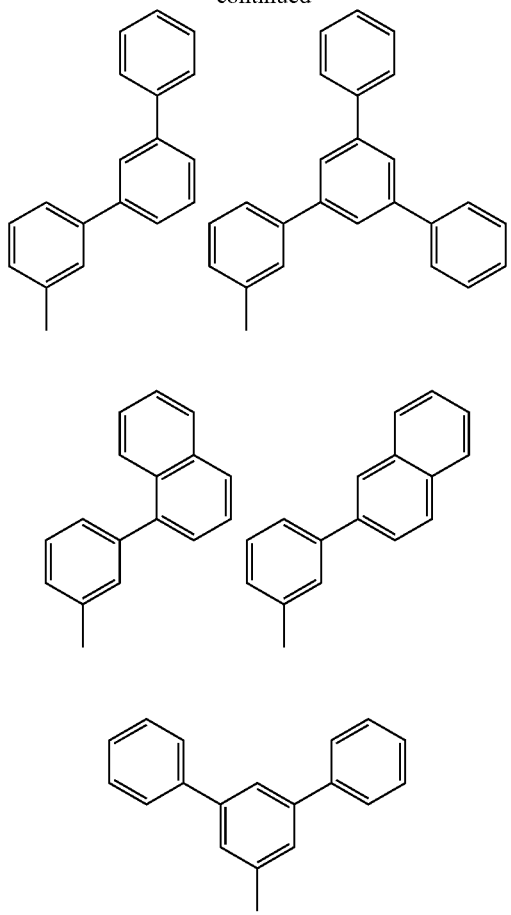
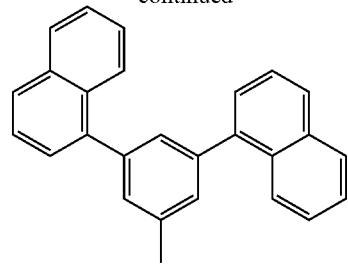
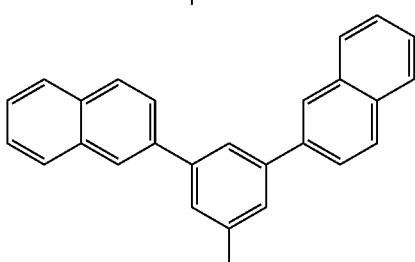
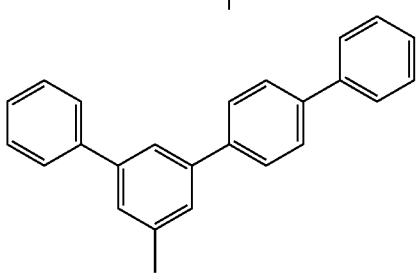
Herein, groups of the above-mentioned specific examples may be further substituted or not. A description of the substituent is as mentioned above. An example of the compound represented by the general formula (1) is shown below.
[Chemical Formula 6]
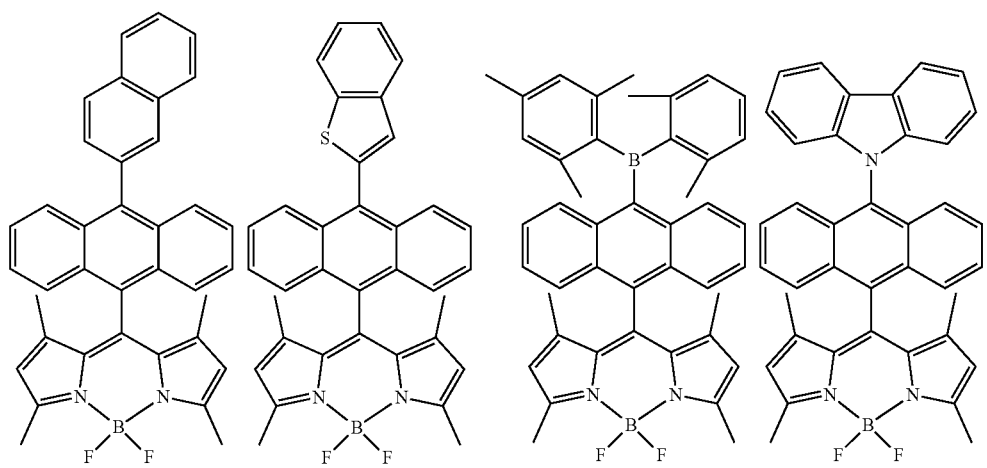

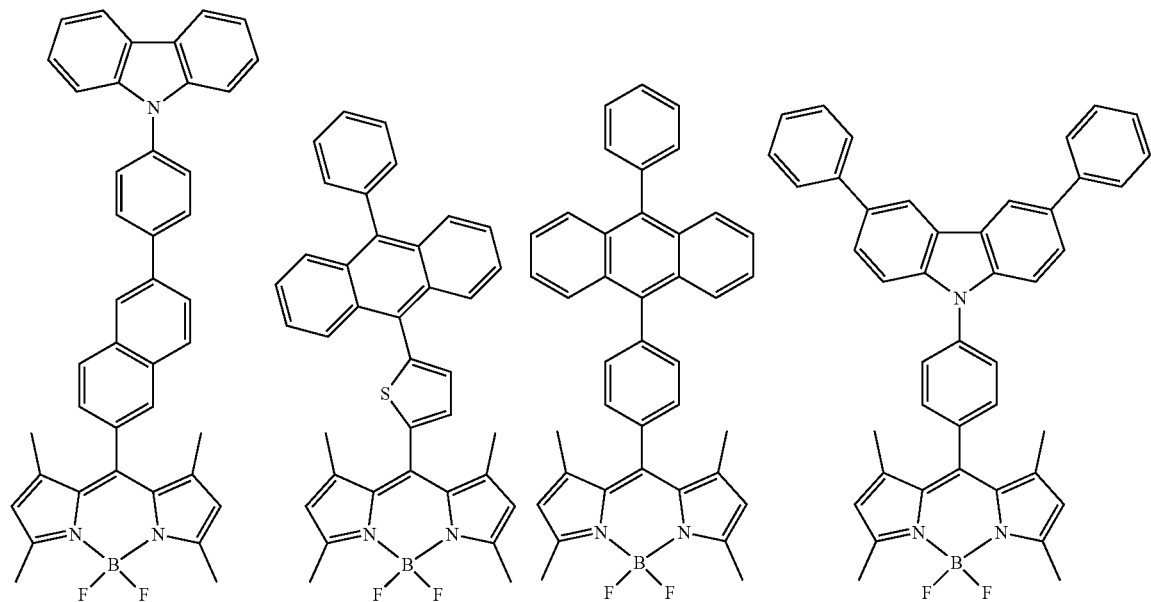
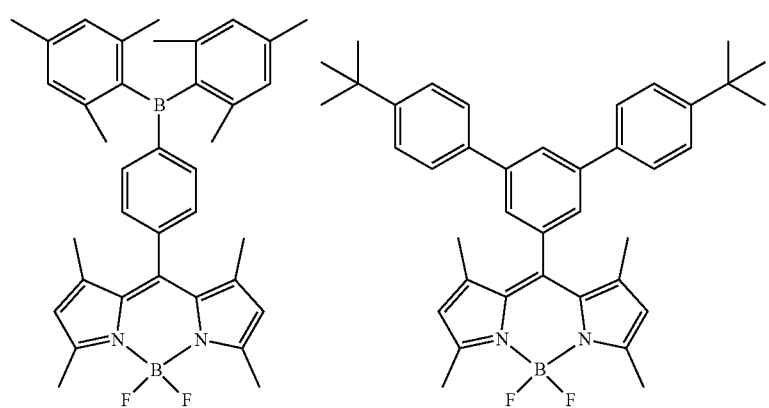
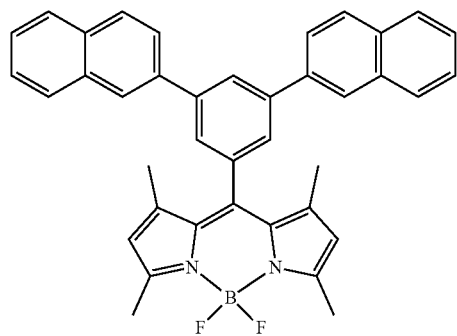

[Chemical Formula 7]
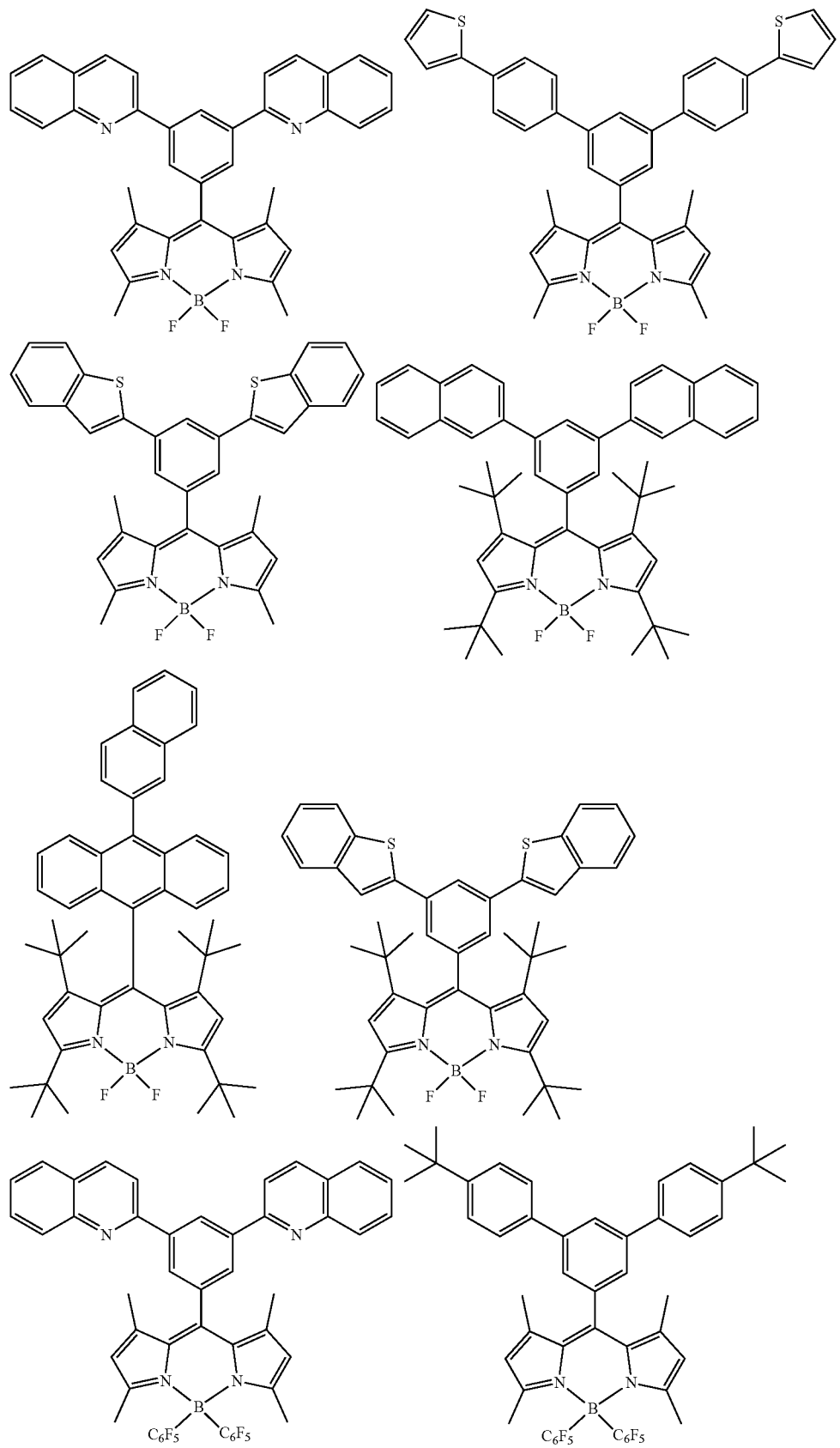

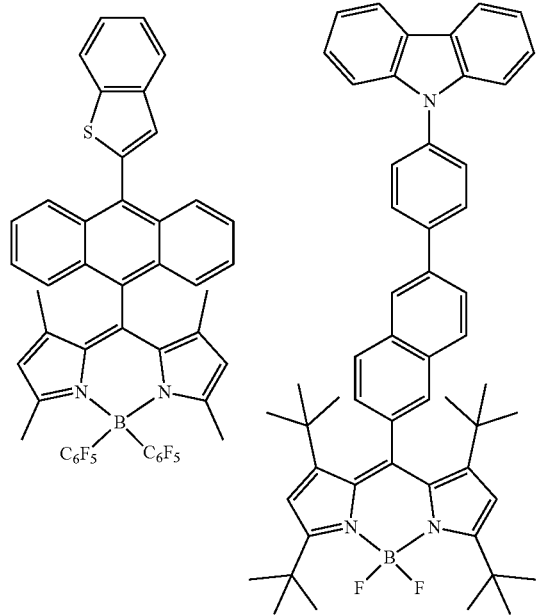
[Chemical Formula 8]
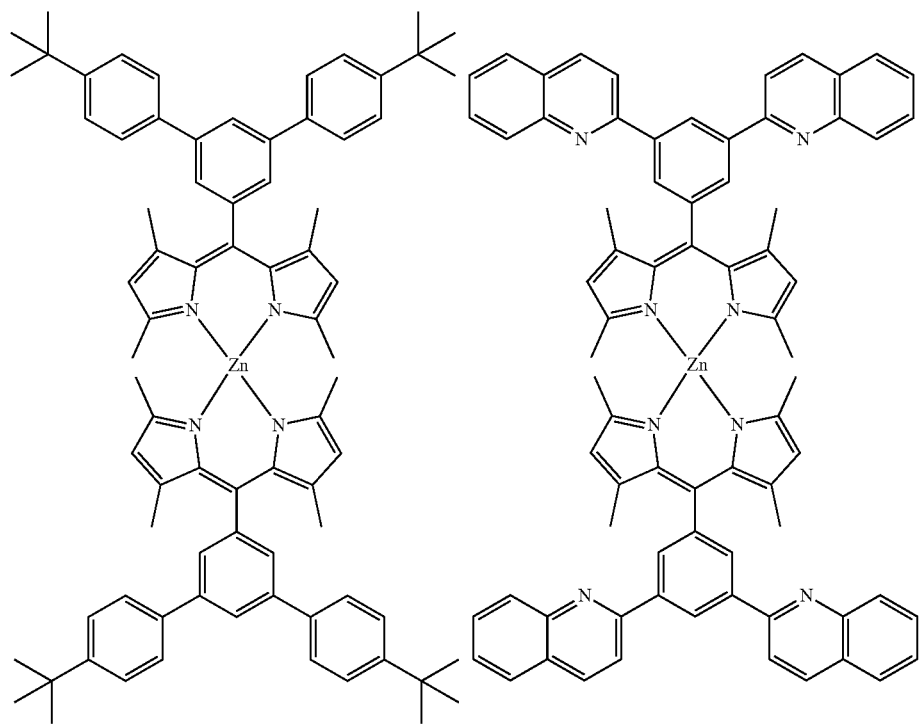

-continued
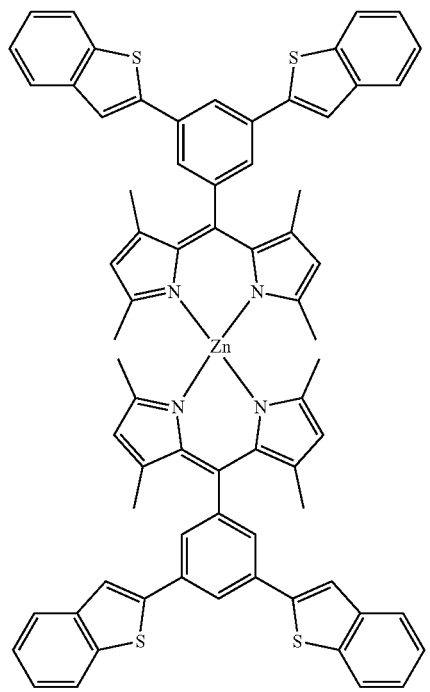
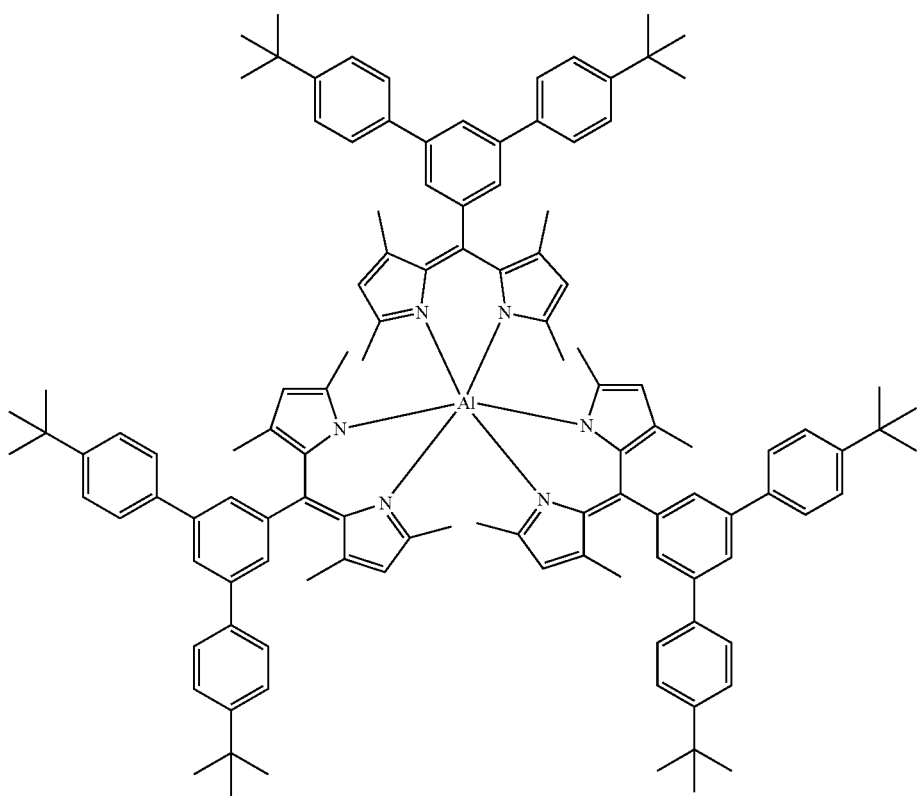

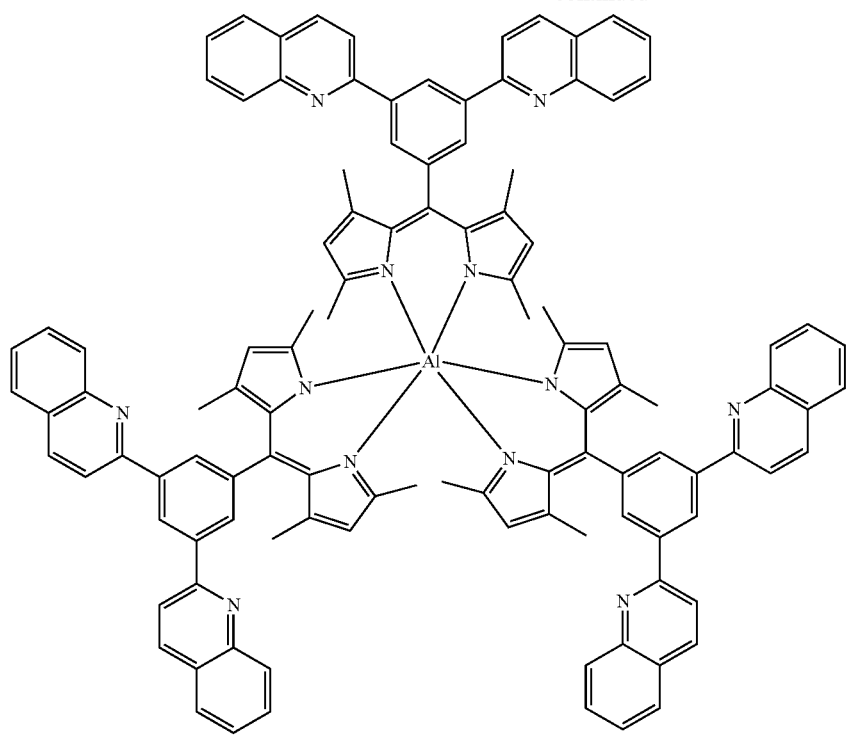
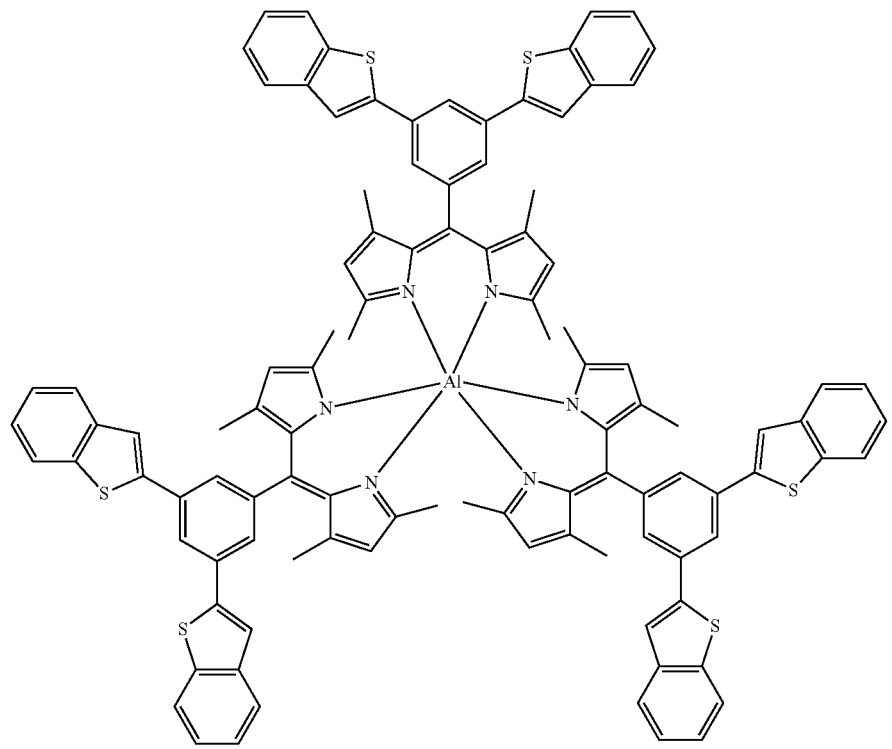

[Chemical Formula 9]
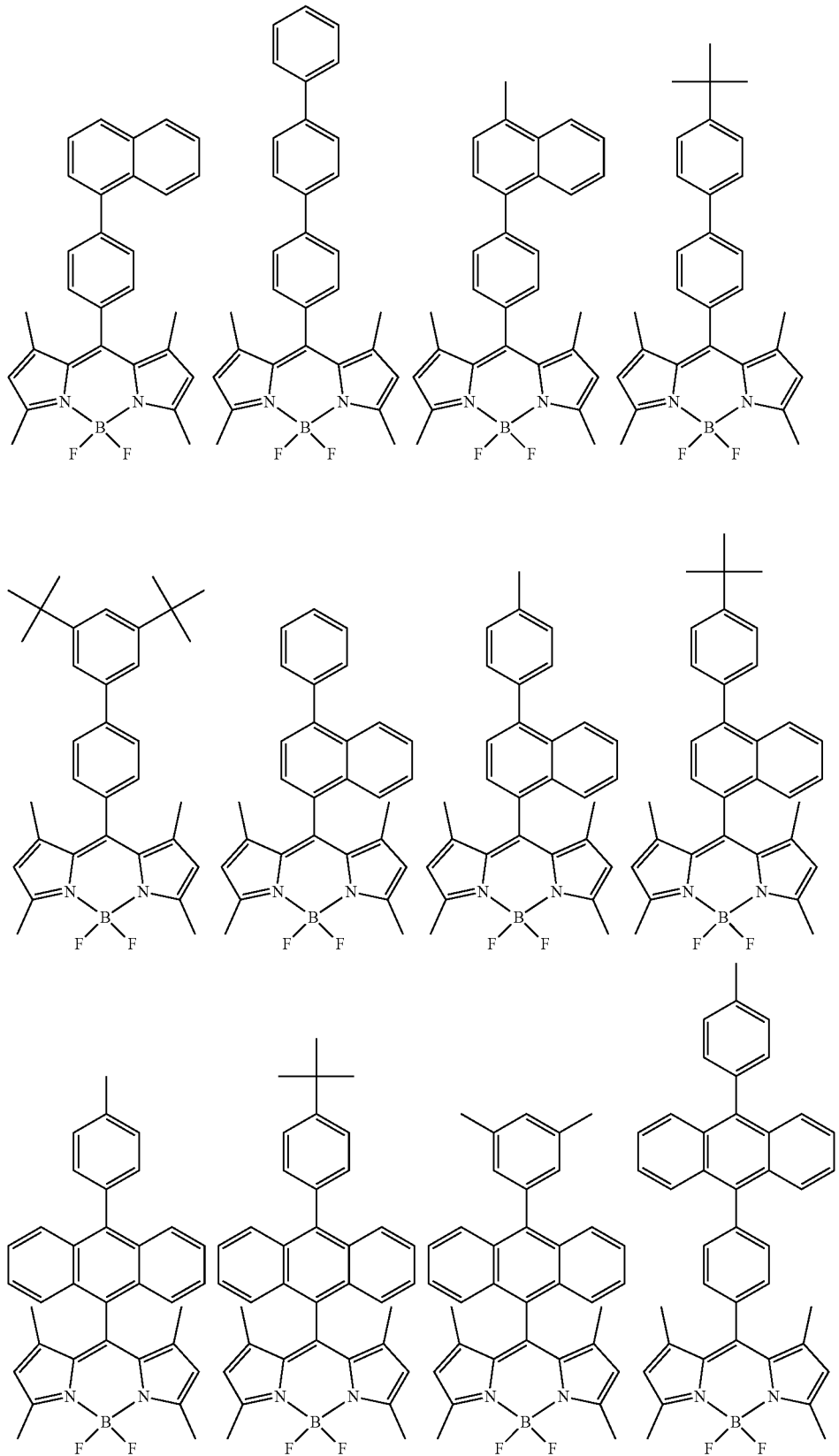

-continued
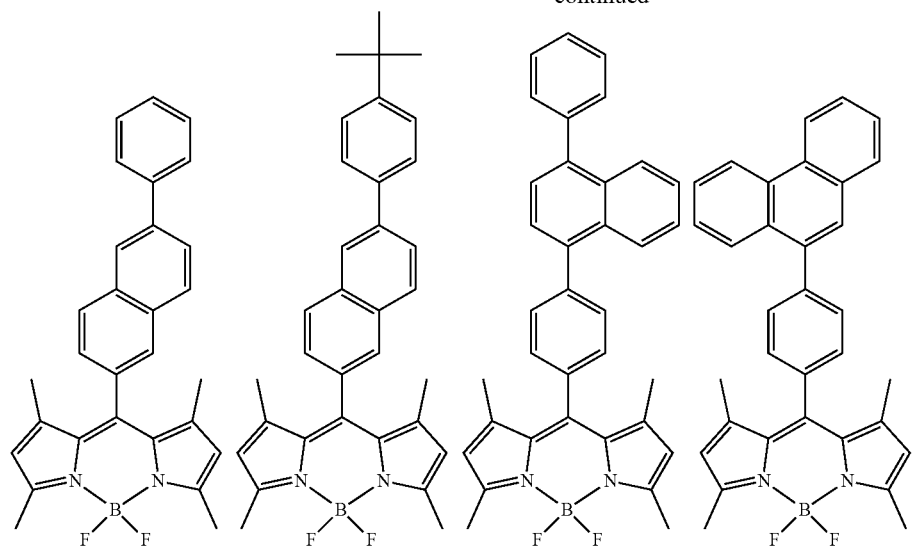
[Chemical Formula 10]
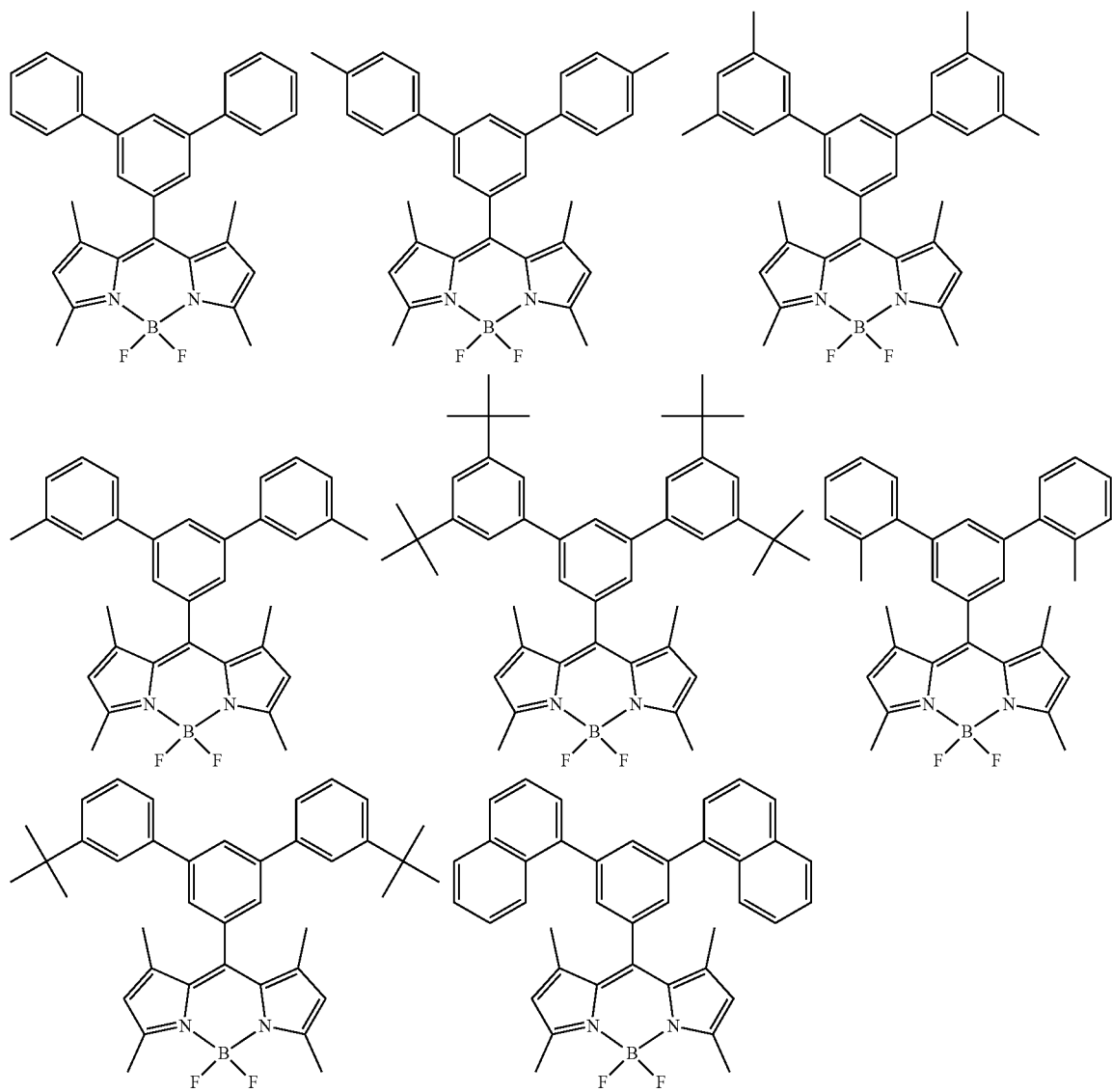

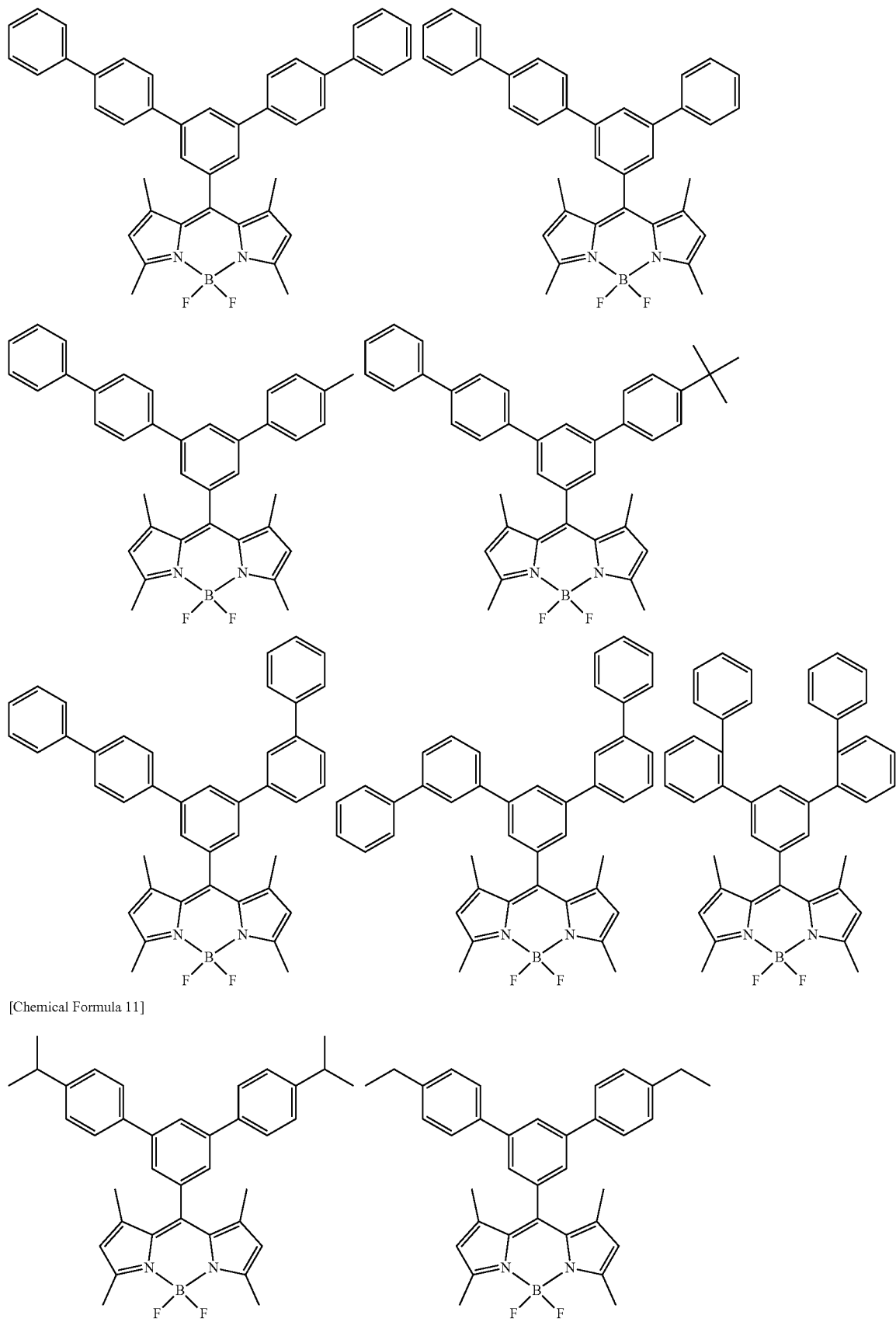
[Chemical Formula 11]

-continued
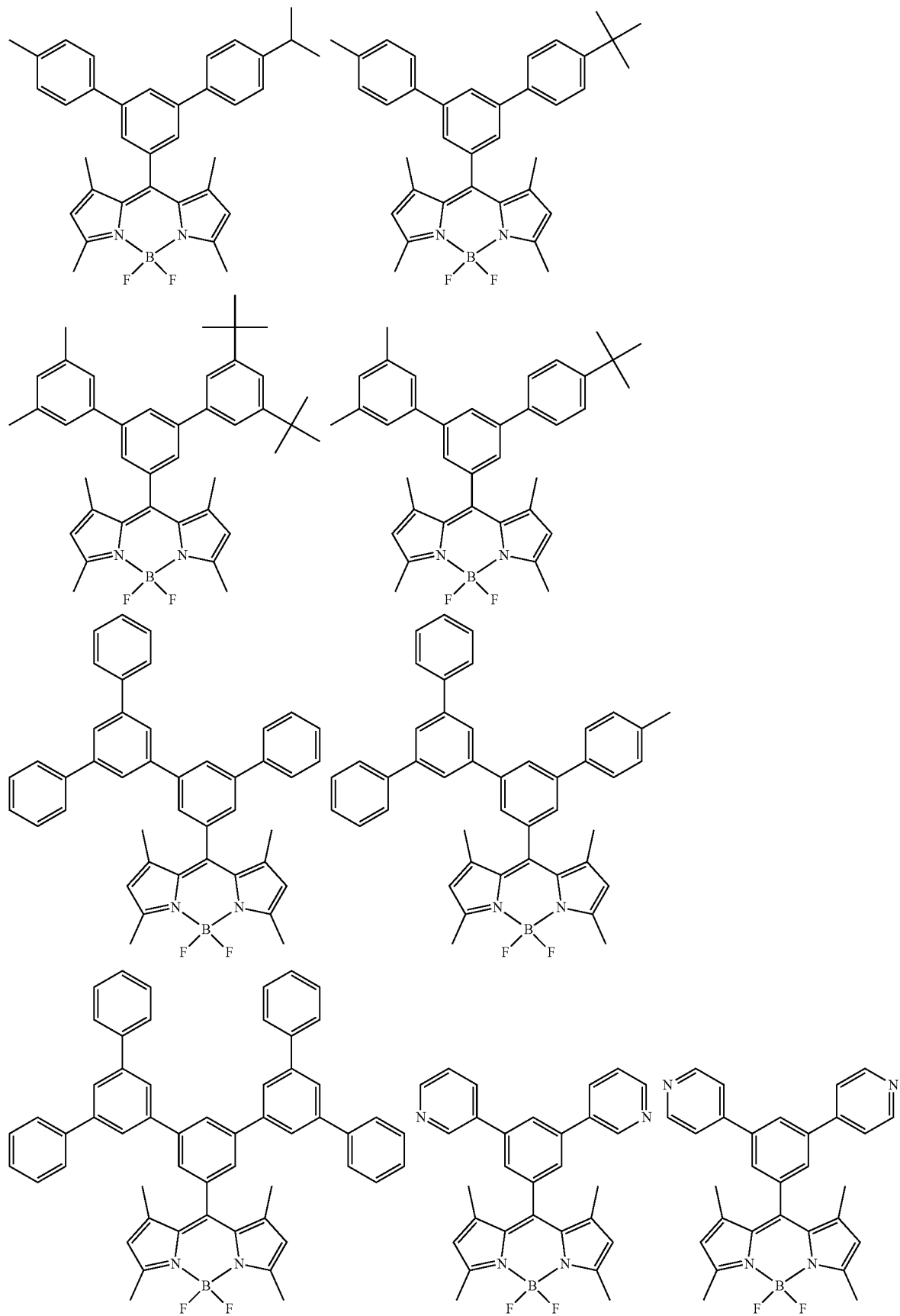

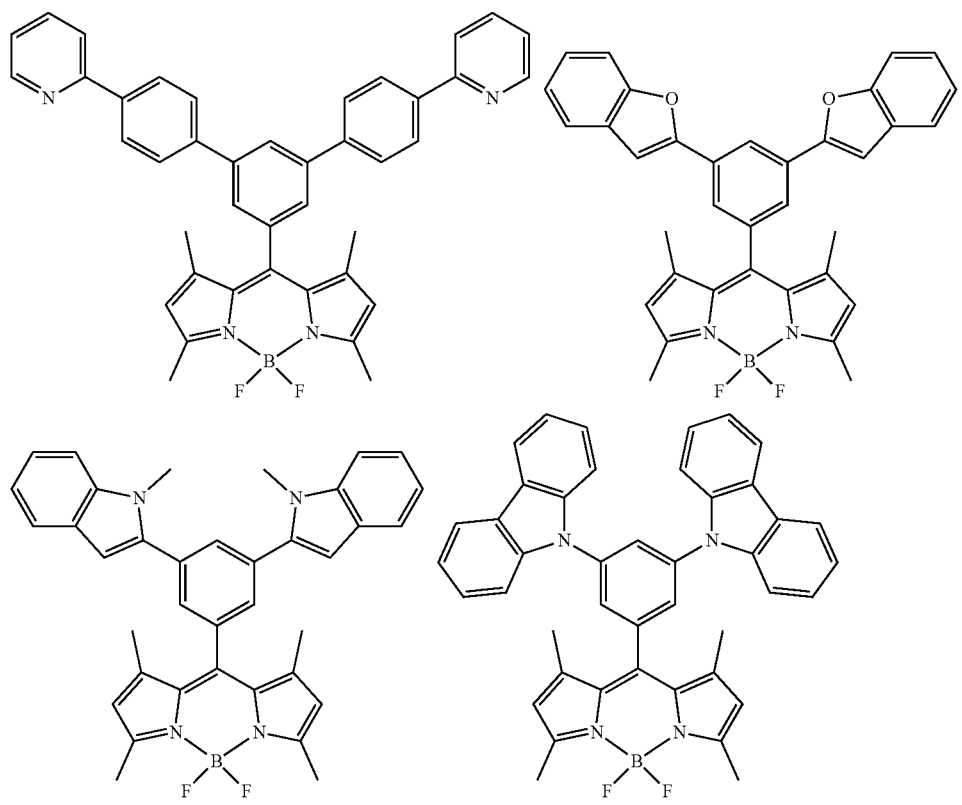
[Chemical Formula 12]
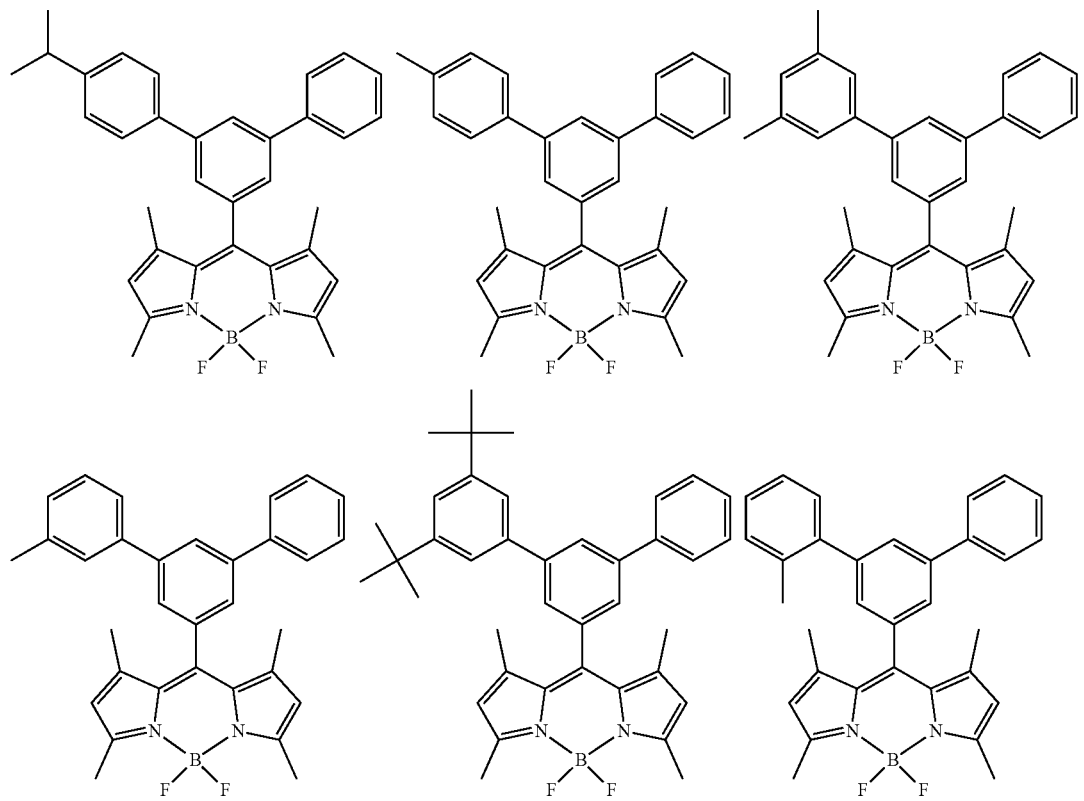

35 36
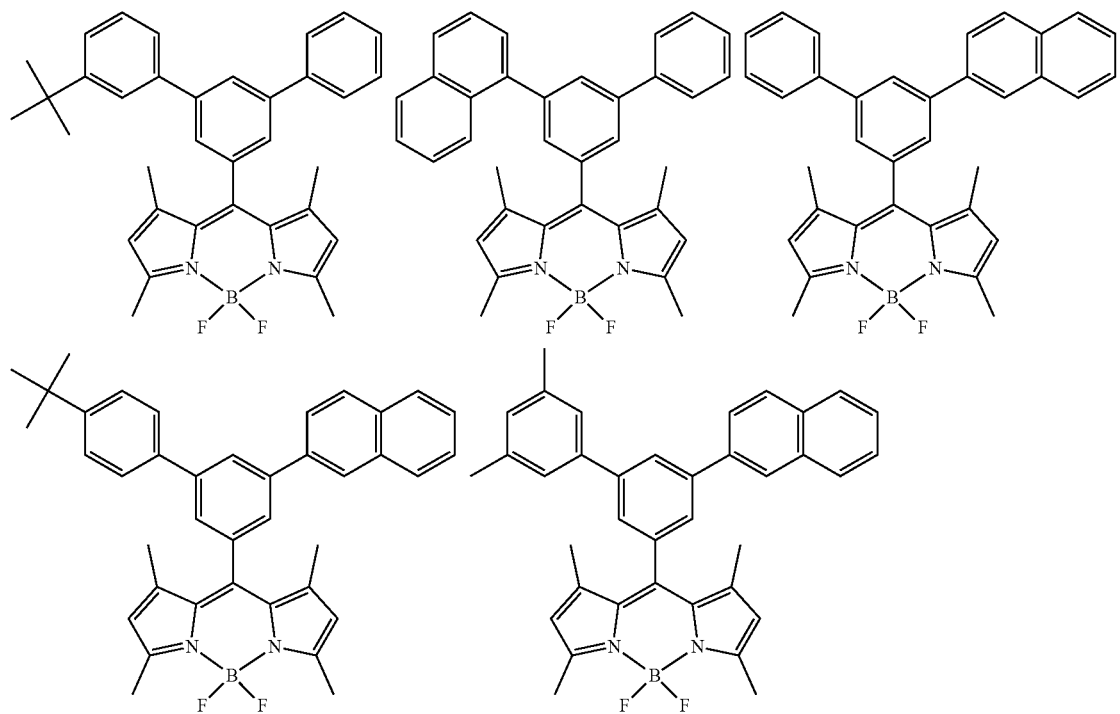
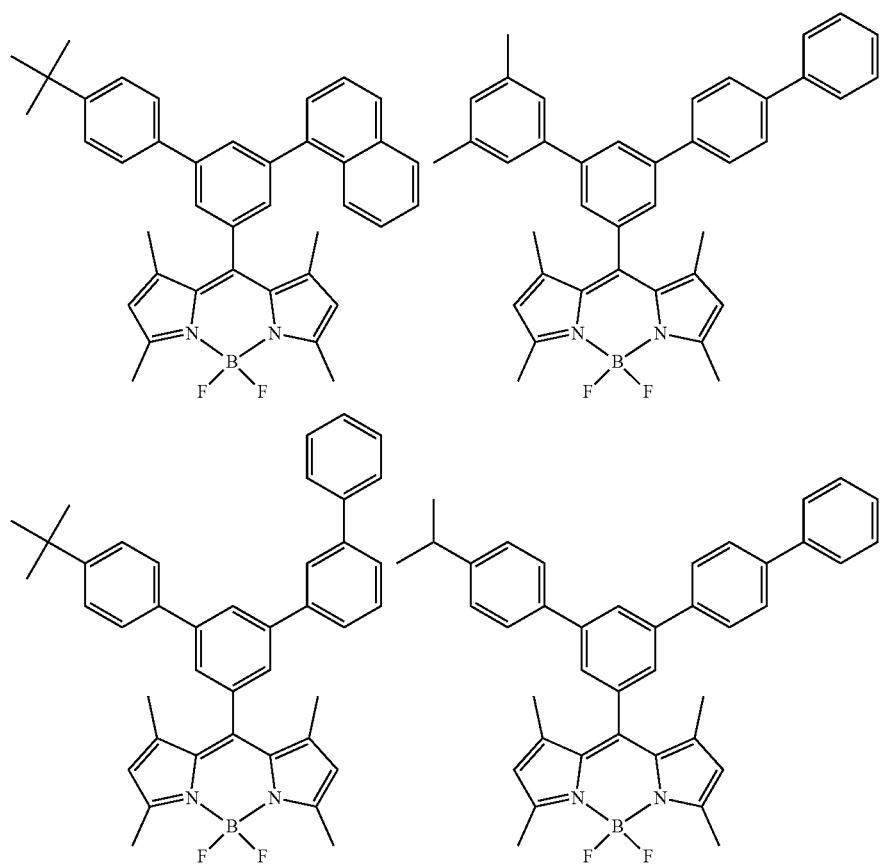

[Chemical Formula 13]
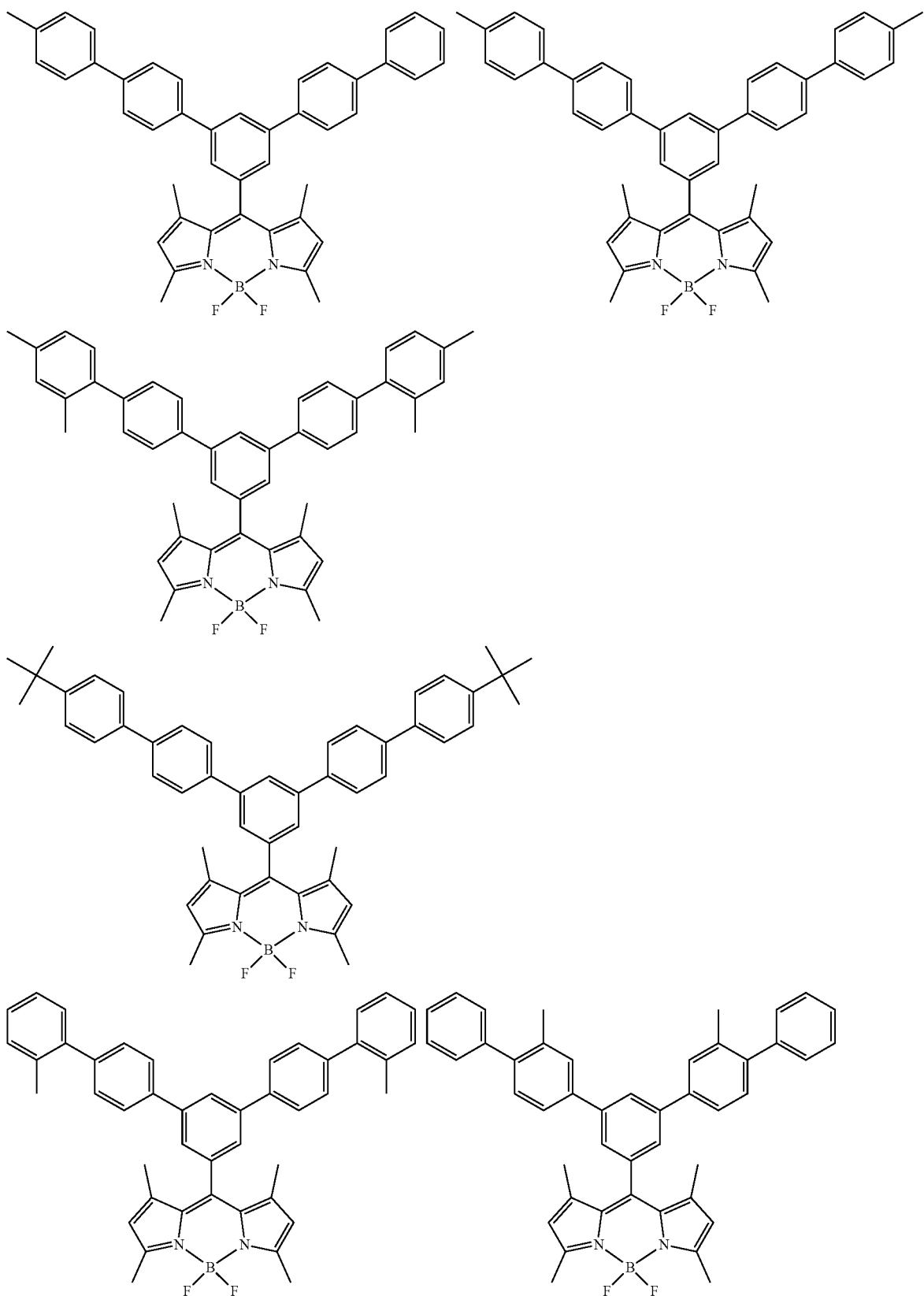

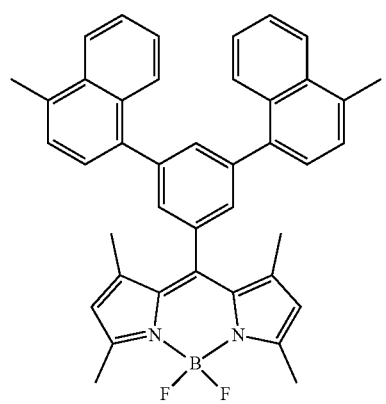
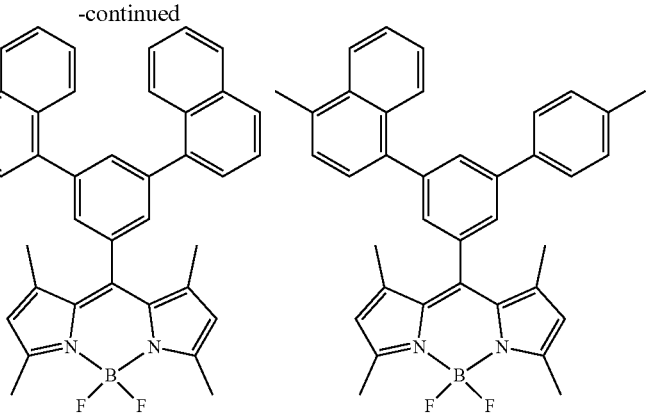

The compound represented by the general formula (1) can be produced, for example, by the methods disclosed in Japanese Translation of PCT International Application Publication No. 8-509471 and Japanese Unexamined Patent Publication (Kokai) No. 2000-208262. Namely, the objective pyrromethene-based metal complex can be obtained by reacting a pyrromethene compound with a metal salt in the co-presence of a base.

With respect to synthesis of a pyrromethene-boron fluoride complex, the compound can be produced with reference to the methods disclosed in J. Org. Chem., Vol. 64, No. 21, pp. 7813-7819 (1999), Angew. Chem., Int. Ed. Engl., Vol. 36, pp. 1333-1335 (1997), and the like. Namely, a compound represented by the general formula (6) below is reacted with a compound represented by the general formula (7) in dichloromethane to form a pyrromethene skeleton, and then boron trifluoride diethyl ether is added in the presence of amine to obtain a pyrromethene-boron fluoride complex.

[Chemical Formula 14]

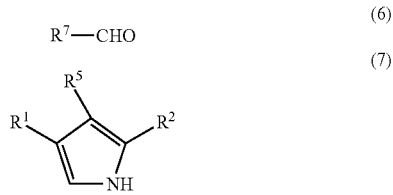

Furthermore, regarding the compound represented by the general formula (6), for example, brominated benzaldehyde is reacted with boronic acid derivatives by Suzuki coupling (References: Chem. Rev., Vol. 95 (1995)) to obtain those in which various aryl groups and heteroaryl groups are introduced into $R^7$.

The compound represented by the general formula (1) is used for a photoelectric conversion layer in the photoelectric conversion element. Furthermore, when the photoelectric conversion layer is composed of two photoelectric conversion element materials each having a correlation between electron-donating and electron-accepting properties, the compound represented by the general formula (1) serves as an n-type organic semiconductor material.

<Image Sensor>

The image sensor is a semiconductor element for converting an optical image into electrical signal. In general, the image sensor is composed of the above-mentioned photoelectric conversion element for converting light into electric energy, and a circuit for reading out electric energy in the form of electrical signal. According to applications of the image sensor, a plurality of photoelectric conversion elements can be aligned on one-dimensional straight line or two-dimensional plane. A monocolor image sensor may include only one photoelectric conversion element, but a color image sensor includes two or more photoelectric conversion elements. For example, the color image sensor includes a photoelectric conversion element for detecting red light, a photoelectric conversion element for detecting green light, and a photoelectric conversion element for detecting blue light. The photoelectric conversion element for each color may be composed of a laminated structure, namely, a structure in which plural photoelectric conversion elements are laminated on one pixel, or a matrix structure in which plural photoelectric conversion elements are arranged side by side.

Figure 7:
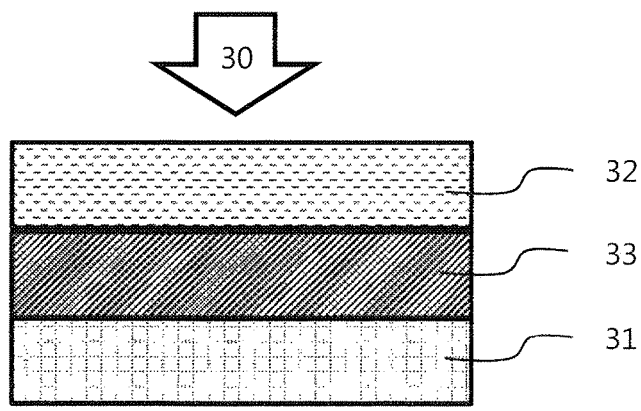
FIG. 7 is a schematic cross-sectional view showing an example of a laminated structure of a photoelectric conversion element of an image sensor of the present invention.
Figure 8:
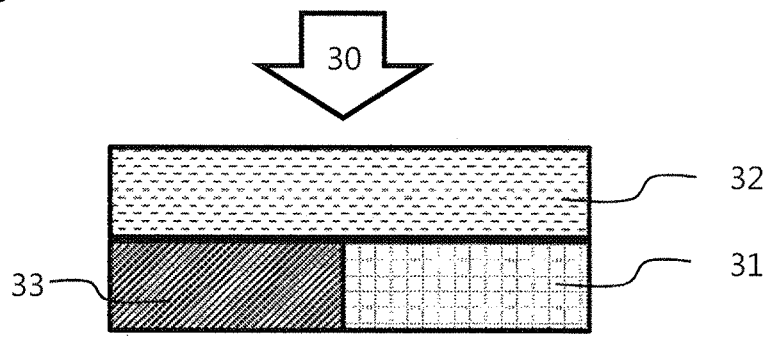
FIG. 8 is a schematic cross-sectional view showing another example of a laminated structure of a photoelectric conversion element of an image sensor of the present invention.

In the case of a structure in which a photoelectric conversion element is laminated on one pixel, as shown in FIG. 7, the structure may be a three-layer structure in which a photoelectric conversion element for detecting green light 32, a photoelectric conversion element for detecting blue light 33, and a photoelectric conversion element for detecting red light 31 are sequentially laminated. Alternatively, as shown in FIG. 8, the structure may be a two-layer structure in which a photoelectric conversion element for detecting green light 32 is disposed on the whole surface of an upper layer, and a photoelectric conversion element for detecting red light 31 and a photoelectric conversion element for detecting blue light 33 are formed on a lower layer in the form of a matrix structure. These structures are those in which the photoelectric conversion element for detecting green light is disposed on a layer which is the nearest to incident light.

Array of the photoelectric conversion element in the case of the matrix structure can be selected from arrays such as Bayer array, honeycomb array, striped array, and delta array.

As mentioned above, since the compound represented by the general formula (1) has a sharp absorption spectrum in the green region, when using as the photoelectric conversion element material of a green photoelectric conversion element, it is possible to transmit red light and blue light by selectively absorb green light. In this case, as shown in FIG. 7, in the case of the structure in which photoelectric conversion elements are arranged in a vertical form, the green photoelectric conversion element is disposed as an uppermost layer, namely, a layer which is the nearest to incident light, thus enabling significant reduction in detected noise of red light and blue light in the green photoelectric conversion element. Because of less absorption of red light and blue light in the green photoelectric conversion element, it is possible to detect light with significantly high sensitivity in red and blue photoelectric conversion elements as the lower layer. Therefore, a color image sensor having excellent color separability can be provided. The order of lamination of each color is not limited thereto, and may be different from that in FIG. 7. From the above viewpoint, when using the photoelectric conversion element of the present invention as the photoelectric conversion element for detecting green light, the structure is preferably a structure in which the green photoelectric conversion element is disposed as an uppermost layer. When the blue photoelectric conversion element has excellent color selectivity, it is possible to use a structure in which the blue photoelectric conversion element is disposed as an uppermost layer from a viewpoint of ease of detecting a short wavelength.

The photoelectric conversion element of the present invention is used as the photoelectric conversion element for detecting green light, and it is possible to appropriately use inorganic photoelectric conversion materials and organic photoelectric conversion materials, which have hither to been used, in combination as for the photoelectric conversion element for detecting red light and the photoelectric conversion element for detecting blue light.

EXAMPLES

The present invention will be described below by way of Examples, but the present invention is not limited to these Examples. The number of each compound in the following Examples indicates the number of each of the above-mentioned compounds. Evaluation methods with respect to structural analysis are shown below.

Using superconductive FTNMR EX-270 (manufactured by JEOL, Ltd.), $^1$H-NMR of each compound was measured by a deuterated chloroform solution.

Using a U-3200 type spectrophotometer (manufactured by Hitachi, Ltd.), an absorption spectrum of each compound was measured after vapor deposition of each measurement sample in a film thickness of 50 nm of on a quartz substrate. An absorption coefficient was calculated by Lambert-Beer Law.

Synthesis Example 1

Method for Synthesis of Compound [1]

In a flask, 3,5-dibromobenzaldehyde (3.0 g), 4-t-butyl-phenylboronic acid (5.3 g), tetrakis(triphenylphosphine)palladium(0) (0.4 g), and potassium carbonate (2.0 g) were charged, followed by nitrogen replacement. To this were added deaerated toluene (30 mL) and deaerated water (10 mL), the mixture was refluxed for 4 hours. The reaction solution was cooled to room temperature, and the organic layer was subjected to liquid separation and then washed with a saturated saline solution. This organic layer was dried over magnesium sulfate and, after filtration, the solvent was distilled off. The thus obtained reaction product was purified by silica gel chromatography to obtain 3,5-bis(4-t-butylphenyl)benzaldehyde (3.5 g) as a white solid.

After adding 3,5-bis(4-t-butylphenyl)benzaldehyde (1.5 g) and 2,4-dimethylpyrrole (0.7 g) in the reaction solution, dehydrated dichloromethane (200 mL) and trifluoroacetic acid (1 drop) were added, followed by stirring in a nitrogen atmosphere for 4 hours. A dehydrated dichloromethane solution of 2,3-dichloro-5,6-dicyano-1,4-benzoquinone (0.85 g) was added, followed by stirring for 1 hour. After completion of the reaction, boron trifluoride-diethyl ether complex (7.0 mL) and diisopropylethylamine (7.0 mL) were added, followed by stirring for 4 hours. Furthermore, water (100 mL) was added, followed by stirring and further liquid separation of the organic layer. This organic layer was dried over magnesium sulfate and, after filtration, the solvent was distilled off. The thus obtained reaction product was purified by silica gel chromatography to obtain 0.4 g of a compound [1] mentioned below (yield of 18%). $^1$H-NMR (CDCl3, ppm): 7.95 (s, 1H), 7.63-7.48 (m, 10H), 6.00 (s, 2H), 2.58 (s, 6H), 1.50 (s, 6H), 1.37 (s, 18H).

Light absorption characteristics of the compound [1] are as follows.
Absorption spectrum: λmax 514 nm (thin film: 50 nm)
Full width at half maximum: 39 nm
Absorption coefficient: $1.21 \times 10^5$/cm

[Chemical Formula 15]

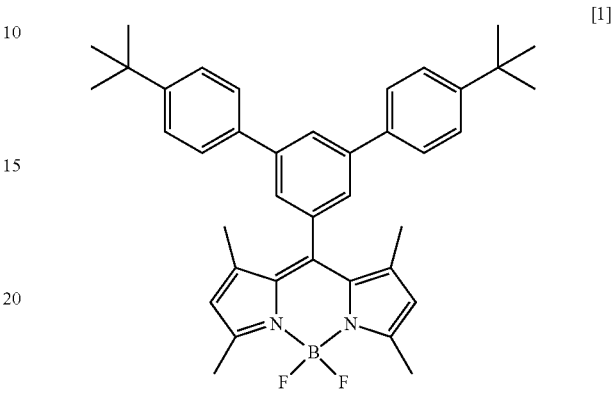

[1]

(Light Absorption Characteristics of Film Containing Compound D-1 and Compound [1])

Figure 5:
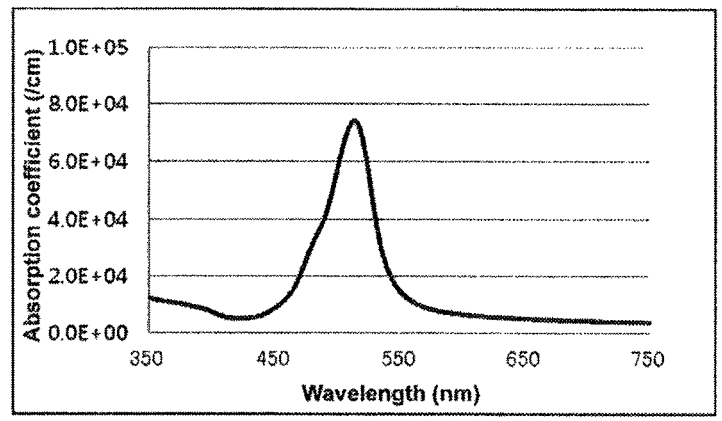
FIG. 5 is an absorption spectrum of a compound used in a photoelectric conversion layer of Example 1.

On a quartz substrate, a compound D-1 mentioned below and the above-mentioned compound [1] were vapor-deposited at a vapor-deposition speed ratio 1:1 in a film thickness of 50 nm. An absorption spectrum of the vapor deposited film was measured. As a result, as shown in FIG. 5, the absorption spectrum was a sharp absorption spectrum having absorption only in the green region. Light absorption characteristics are as follows.
Absorption spectrum: λmax 514 nm
Full width at half maximum: 39 nm
Absorption coefficient: $7.42 \times 10^4$/cm

[Chemical Formula 16]

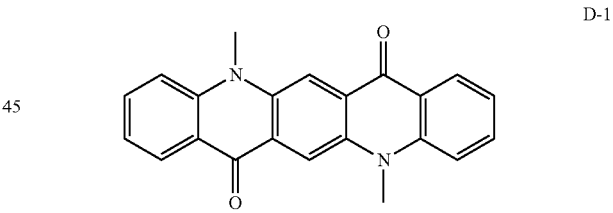

D-1

(Light Absorption Characteristics of Film Containing Compound D-1 and Compound A-1)

Figure 6:
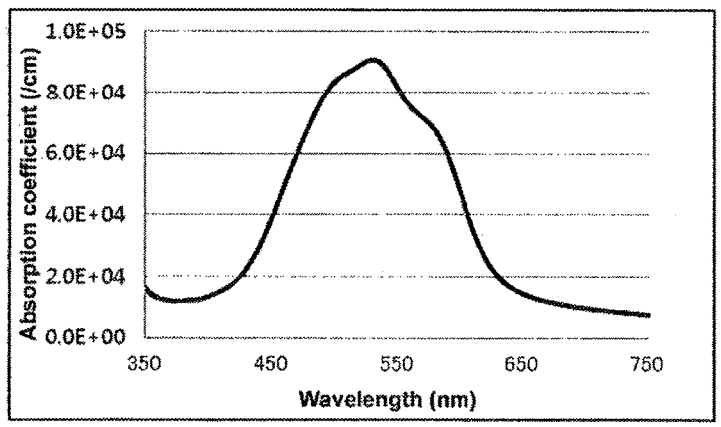
FIG. 6 is an absorption spectrum of a compound used in a photoelectric conversion layer of Comparative Example 1.

In the same manner as in Synthesis Example 1, except that a compound A-1 was used in place of the compound [1], the compound D-1 and the compound A-1 were vapor-deposited on a quartz substrate and an absorption spectrum was measured. As shown in FIG. 6, the absorption spectrum was a broad absorption spectrum having absorption not only in the green region but also in the red region and the blue region. Light absorption characteristics are as follows.
Absorption spectrum: λmax 529 nm
Full width at half maximum: 142 nm
Absorption coefficient: $9.06 \times 10^4$/cm Example 1

A photoelectric conversion element using the compound [1] was produced in the following manner. A glass substrate (manufactured by Asahi Glass Co., Ltd., 15Ω/□, electron beam vapor-deposited product) including an ITO transparent conductive film having a film thickness of 150 nm deposited thereon was cut into pieces of 30×40 mm in size, followed by etching to obtain an anode substrate. The anode substrate thus obtained was subjected to ultrasonic cleaning for 15 minutes each, using acetone and "SEMICOCLEAN (registered trademark) 56" (manufactured by Furuuchi Chemical Corporation), and then washed with ultra-pure water. Subsequently, the anode substrate was subjected to ultrasonic cleaning for 15 minutes, using isopropyl alcohol, immersed in hot methanol for 15 minutes, and then dried. Immediately before the production of an element, this anode substrate was subjected to a UV ozone treatment for 1 hour. After placing in a vacuum vapor deposition device, an inside of the device was evacuated until the degree of vacuum becomes $5 \times 10^{-5}$ Pa or less. On the ITO layer of this anode substrate, molybdenum oxide was vapor-deposited as an electron blocking layer in a film thickness of 30 nm by a resistance heating method. Next, the compound D-1 and the compound [1] were codeposited as a photoelectric conversion layer at a vapor-deposition speed ratio of 1:1. Next, aluminum was vapor-deposited as a cathode in a film thickness of 100 nm to obtain an element of 5 mm square. The film thickness as used herein is an indicated value of a crystal oscillation type thickness monitor.

Comparative Example 1

In the same manner as in Example 1, except that a compound A-1 was used in place of the compound [1] when a photoelectric conversion layer is vapor-deposited, a photoelectric conversion element was produced.

[Chemical Formula 17]

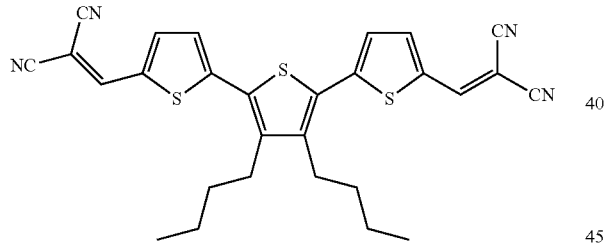

A-1

Figure 9:
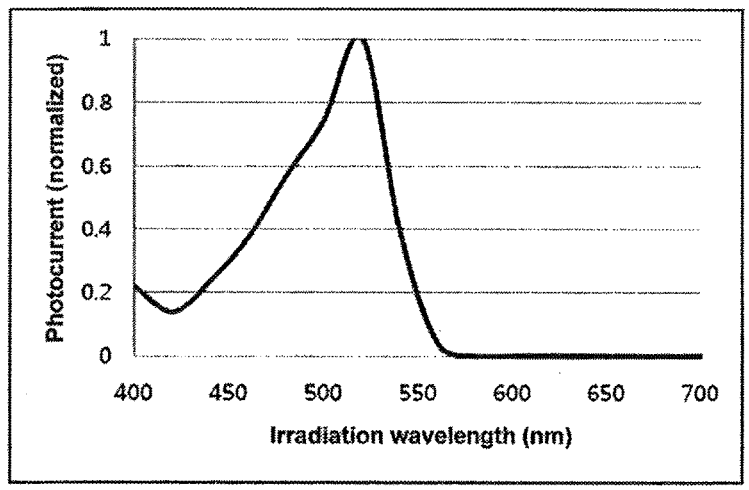
FIG. 9 shows spectral sensitivity of a photoelectric conversion element of Example 1.
Figure 10:
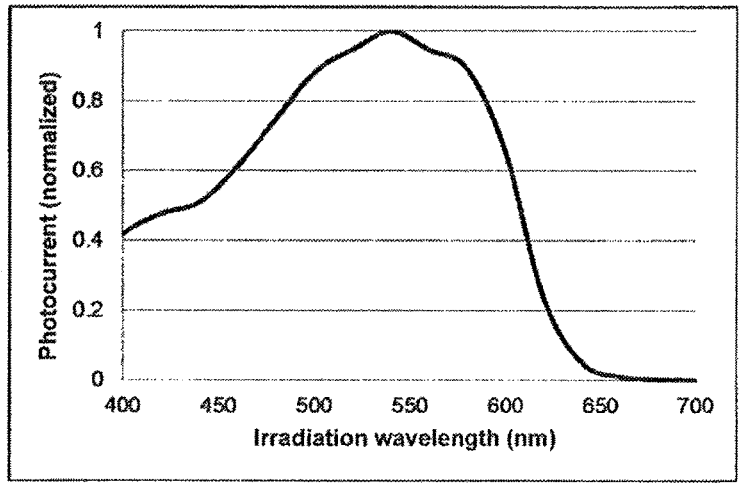
FIG. 10 shows spectral sensitivity of a photoelectric conversion element of Comparative Example 1.

Spectral sensitivity when a bias voltage (−3 V) is applied to each of photoelectric conversion elements of Example 1 and Comparative Example 1 is shown in FIG. 9 and FIG. 10. The spectral sensitivity was measured by determining an output current when the photoelectric conversion element is irradiated with monochromatic light having a wavelength in a range of 400 nm to 700 nm, using a spectral sensitivity measurement system (SM-250, manufactured by Bunkoukeiki Co., Ltd.).

In the element of Example 1, photoelectric conversion could be performed with satisfactory selectivity in the green region having a wavelength of 450 nm or more and 550 nm or less. Meanwhile, in the element of Comparative Example 1, photoelectric conversion was performed in the blue region having a wavelength of less than 450 nm and the red region having a wavelength of longer than 550 nm, thus resulting in inferior color selectivity.

Examples 2 to 3

In the same manner as in Example 1, except that the vapor-deposition speed ratio of the compound D-1 to the compound [1] was changed to 2:1 and 3:1, photoelectric conversion elements were produced. Photoelectric conversion characteristics when a bias voltage (−5 V) is applied to each photoelectric conversion element is shown in Table 1. Both elements exhibited photoelectric conversion characteristics with satisfactory color selectivity.

Examples 4 to 10, Comparative Example 2

In the same manner as in Example 1, except that compounds mentioned below were used as an n-type semiconductor material in place of the compound [1], photoelectric conversion elements were produced. Photoelectric conversion characteristics when a bias voltage (−5 V) is applied to each photoelectric conversion element is shown in Table 1. Satisfactory color selectivity was exhibited because of small full width at half maximum of an absorption spectrum in Examples 4 to 10, whereas, color selectivity deteriorated because of large full width at half maximum of an absorption spectrum in Comparative Example 2.

[Chemical Formula 18]

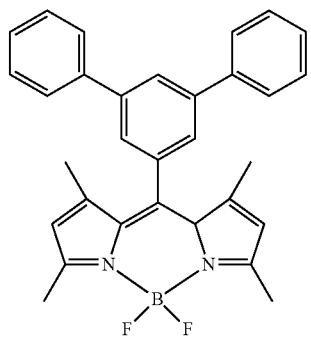

[2]

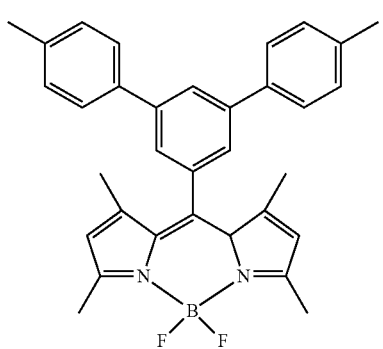

[3]

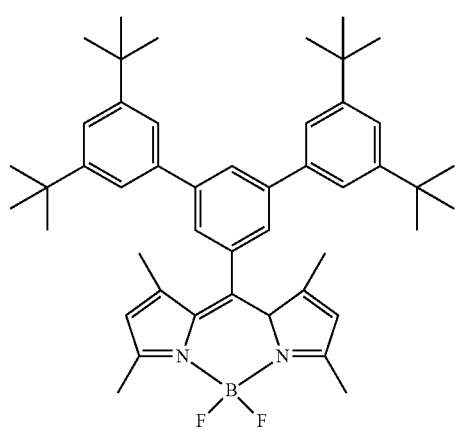

[4]

[5]
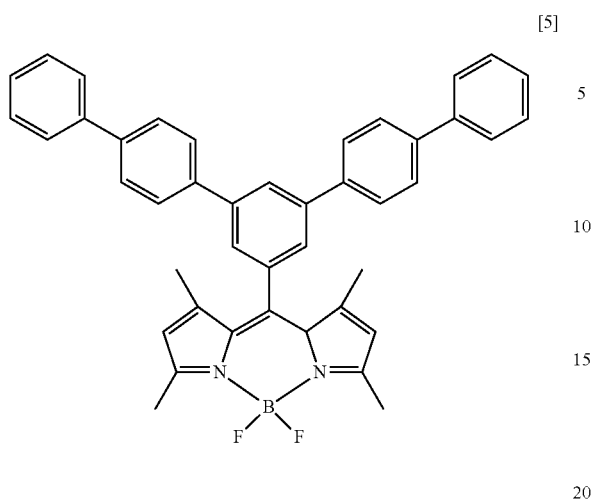
[8]
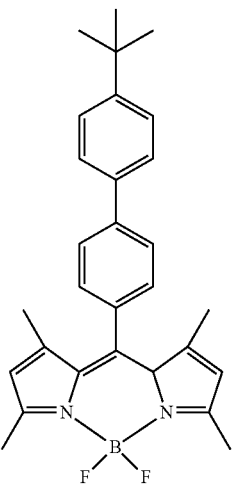
[6]
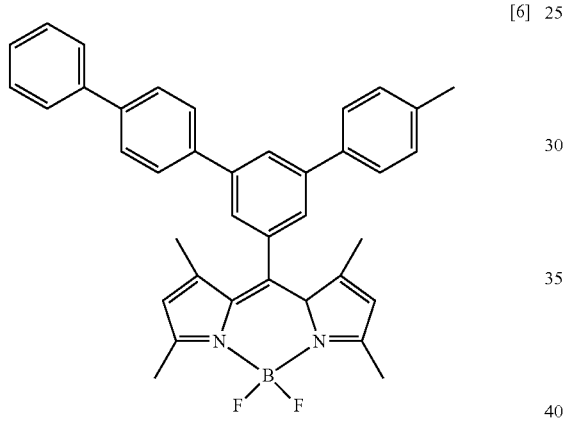
[9]
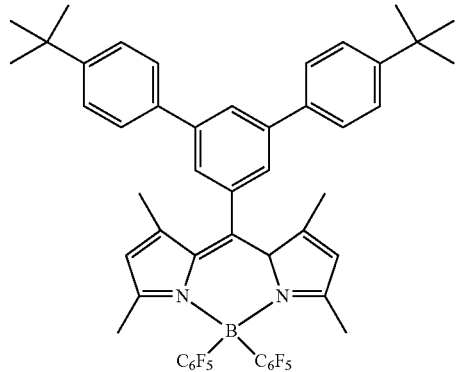
[7]
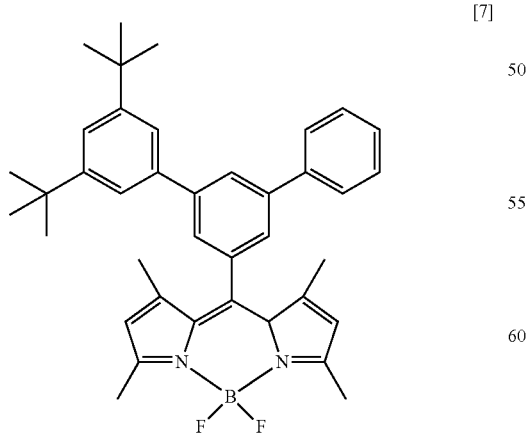
[Chemical Formula 19]
A-2
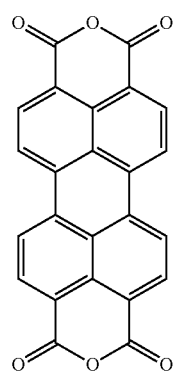

TABLE 1

| | p-type semi-conductor material | n-type semi-conductor material | Mixing ratio of p-type semiconductor material and n-type semi-conductor material | Maximum absorption wavelength (nm) | Full width at half maximum (nm) | Absorption coefficient at maximum absorption wavelength (cm$^{-1}$) | Maximum sensitivity wavelength (nm) | External quantum efficiency at maximum sensitivity wavelength (%) |
|---|---|---|---|---|---|---|---|---|
| Example 1 | D-1 | Compound [1] | 1:1 | 514 | 39 | 7.42 × 10$^4$ | 510 | 18 |
| Example 2 | D-1 | Compound [1] | 2:1 | 509 | 48 | 3.89 × 10$^4$ | 510 | 22 |
| Example 3 | D-1 | Compound [1] | 3:1 | 511 | 58 | 2.50 × 10$^4$ | 520 | 29 |
| Example 4 | D-1 | Compound [2] | 1:1 | 517 | 40 | 7.20 × 10$^4$ | 520 | 16 |
| Example 5 | D-1 | Compound [3] | 1:1 | 518 | 43 | 7.15 × 10$^4$ | 520 | 16 |
| Example 6 | D-1 | Compound [4] | 1:1 | 520 | 44 | 7.24 × 10$^4$ | 520 | 15 |
| Example 7 | D-1 | Compound [5] | 1:1 | 518 | 41 | 7.31 × 10$^4$ | 520 | 17 |
| Example 8 | D-1 | Compound [6] | 1:1 | 515 | 40 | 7.19 × 10$^4$ | 520 | 14 |
| Example 9 | D-1 | Compound [7] | 1:1 | 521 | 41 | 7.26 × 10$^4$ | 520 | 15 |
| Example 10 | D-1 | Compound [8] | 1:1 | 524 | 41 | 7.10 × 10$^4$ | 520 | 14 |
| Example 11 | D-1 | Compound [9] | 1:1 | 515 | 45 | 6.89 × 10$^4$ | 520 | 12 |
| Comparative Example 1 | D-1 | A-1 | 1:1 | 529 | 142 | 9.06 × 10$^4$ | 530 | 49 |
| Comparative Example 2 | D-1 | A-2 | 1:1 | 502 | 100 | 5.36 × 10$^4$ | 510 | 27 |

The photoelectric conversion element of the present invention can be applied in the fields of image sensors and solar cells. Specifically, the photoelectric conversion element can be employed in the fields of image elements mounted in mobile phones, smartphones, tablet PCs, digital still cameras, and the like; and sensing devices such as photovoltaic power generating apparatuses and visible light sensors.

REFERENCE SIGNS LIST

10 First electrode
13 Electron blocking layer
15 Photoelectric conversion layer
17 Hole blocking layer
20 Second electrode
30 Light
31 Photoelectric conversion element for detecting red light
32 Photoelectric conversion element for detecting green light
33 Photoelectric conversion element for detecting blue light

The invention claimed is:

1. An image sensor including photoelectric conversion elements which detect red light, green light, and blue light, wherein the photoelectric conversion element for detecting green light comprises a first electrode, a second electrode, and at least one organic layer existing therebetween, the organic layer containing a compound represented by the general formula (1):

[Chemical Formula 1]

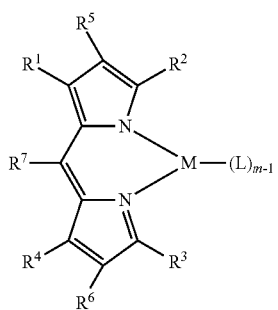

(1)

wherein $R^1$ to $R^4$ are alkyl groups, cycloalkyl groups, alkoxy groups, or arylether groups, which may be respectively the same or different; $R^5$ and $R^6$ are halogens, hydrogens, or alkyl groups, which may be respectively the same or different; $R^7$ is an aryl group, a heteroaryl group, or an alkenyl group; M represents an m-valent metal and is at least one selected from boron, beryllium, magnesium, aluminum, chromium, iron, nickel, copper, zinc, and platinum; L is selected from halogen, hydrogen, an alkyl group, an aryl group, and a heteroaryl group; and m is in a range of 1 to 6 and, when m−1 is 2 or more, each L may be the same or different.

2. The image sensor according to claim 1, wherein $R^1$ to $R^4$ of the general formula (1) are methyl groups, and $R^5$ and $R^6$ are hydrogens.

3. The image sensor according to claim 1, wherein M of the general formula (1) is boron, L is fluorine or a fluorine-containing aryl group, and m−1 is 2.

4. The image sensor according to claim 1, wherein $R^7$ of the general formula (1) is an aryl group or a heteroaryl group.

5. The image sensor according to claim 4, wherein $R^7$ of the general formula (1) is represented by the following general formula (2):

[Chemical Formula 2]

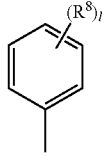

(2)

wherein $R^8$ is an aryl group or a heteroaryl group, and l is an integer of 1 to 3 and, when l is 2 or more, each $R^8$ may be the same or different.

6. The image sensor according to claim 1, wherein the organic layer includes a photoelectric conversion layer, and the photoelectric conversion layer contains a compound represented by the general formula (1).

7. The image sensor according to claim 6, wherein the photoelectric conversion layer is composed of two photoelectric conversion element materials, and one of them is a compound represented by the general formula (1).

8. The image sensor according to claim 7, wherein two photoelectric conversion element materials are respectively an electron-donating and electron-accepting photoelectric conversion element materials, and the compound represented by the general formula (1) is the electron-accepting photoelectric conversion element material.

9. The image sensor according to claim 1, wherein the photoelectric conversion elements have a laminated structure.

10. The image sensor according to claim 1, wherein the photoelectric conversion element for detecting green light is disposed on a layer which is the nearest to incident light.

* * * * *